United States Patent [19]

Oliver et al.

[11] Patent Number: 5,736,856
[45] Date of Patent: *Apr. 7, 1998

[54] METHOD AND APPARATUS FOR PERFORMING MAGNETIC FIELD MEASUREMENTS USING MAGNETO-OPTIC KERR EFFECT SENSORS

[75] Inventors: Steven A. Oliver, Dedham; Charles A. DiMarzio, Cambridge, both of Mass.

[73] Assignee: Northeastern University, Boston, Mass.

[*] Notice: The term of this patent shall not extend beyond the expiration date of Pat. No. 5,631,559.

[21] Appl. No.: 744,923

[22] Filed: Nov. 6, 1996

Related U.S. Application Data

[63] Continuation of Ser. No. 474,692, Jun. 7, 1995, Pat. No. 5,631,559, which is a continuation-in-part of Ser. No. 26,589, Mar. 5, 1993, Pat. No. 5,493,220.

[51] Int. Cl.⁶ .......... G01R 33/032; G02F 1/09
[52] U.S. Cl. .......... 324/244.1; 359/280; 324/260
[58] Field of Search .......... 324/244.1, 175, 324/207.25, 207.13, 96, 97, 117 R, 117 H, 364, 260; 356/33, 34, 365, 368; 250/225; 359/280–283

[56] References Cited

U.S. PATENT DOCUMENTS

| | | | |
|---|---|---|---|
| 3,609,723 | 9/1971 | Alstad et al. | 340/174.1 M |
| 3,971,038 | 7/1976 | Myer | 340/174 TF |
| 4,059,829 | 11/1977 | Kinsmer et al. | 365/19 |
| 4,079,429 | 3/1978 | Travot et al. | |
| 4,365,310 | 12/1982 | Green | 364/822 |
| 4,442,350 | 4/1984 | Rashleigh | 250/227 |
| 4,450,406 | 5/1984 | Bobb | 324/247 |
| 4,482,400 | 11/1984 | O'Handley | 148/31.55 |
| 4,491,867 | 1/1985 | Huignard | 358/113 |
| 4,516,073 | 5/1985 | Doriath et al. | 324/244 |
| 4,563,646 | 1/1986 | Desormiere | 324/244 |
| 4,564,289 | 1/1986 | Spillman, Jr. | 356/33 |
| 4,604,577 | 8/1986 | Matsumura et al. | 324/244 |
| 4,609,871 | 9/1986 | Bobb | 324/244 |
| 4,618,901 | 10/1986 | Hatakeyama et al. | 360/114 |
| 4,627,298 | 12/1986 | Sahashi et al. | 73/862.36 |
| 4,634,977 | 1/1987 | Lenz et al. | 324/244 |
| 4,658,148 | 4/1987 | Naito | 250/571 |
| 4,742,300 | 5/1988 | Lenz et al. | 324/244 |
| 4,746,791 | 5/1988 | Forkel | 250/231.18 |
| 4,762,008 | 8/1988 | Kobayashi et al. | 73/862.36 |
| 4,782,705 | 11/1988 | Hoffman et al. | 73/776 |
| 4,806,858 | 2/1989 | Elbicki | 324/205 |
| 4,816,761 | 3/1989 | Josephs | 324/212 |
| 4,866,381 | 9/1989 | Tatsuhiko | 324/207.25 |

(List continued on next page.)

OTHER PUBLICATIONS

Bushnell, S.E. et al., The Measurement of Magnetostriction Constants of Thin Films Using Planar Microwave Devices and Ferromagnetic Resonance, Rev. Sci. Instrum. 63(3):2021, Mar. 1992, pp. 2021–2025.

Minden, H.T., Sensitive Method for the Measurement of the Kerr Magneto–Optic Effect, Rev. Sci. Instrum. 63(2): 1798, Feb. 1992, pp. 1798–1804.

Nader–Rezvani, N. et al., Low Frequency Fiber Optic Magnetic Field Sensors, Optical Engineering 31 (1):23, Jan. 1992, pp. 23–27.

(List continued on next page.)

*Primary Examiner*—Walter E. Snow
*Attorney, Agent, or Firm*—Weingarten, Schurgin, Gagnebin & Hayes LLP

[57] ABSTRACT

A sensor system includes a magneto-optic Kerr effect magnetic field sensing element and an optical system including a light source, at least one polarizer or polarizing element and a detector disposed about the sensing element. The sensing element is responsive to an external magnetic field. In one embodiment, the optical system and sensing element can be arranged to measure the strength of a magnetic field. In another embodiment the optical system and sensing element can be arranged to measure the rotational speed of rotating members.

68 Claims, 7 Drawing Sheets

U.S. PATENT DOCUMENTS

| | | | |
|---|---|---|---|
| 4,896,103 | 1/1990 | Shimanuke et al. | 324/96 |
| 4,920,806 | 5/1990 | Obama et al. | 73/799 |
| 4,922,200 | 5/1990 | Jackson et al. | 324/223 |
| 4,925,742 | 5/1990 | Sugawara et al. | 428/692 |
| 4,931,634 | 6/1990 | Toyama | 250/225 |
| 4,939,937 | 7/1990 | Klauber et al. | 73/862.36 |
| 4,947,107 | 8/1990 | Doerfler et al. | 324/96 |
| 4,969,720 | 11/1990 | Lins et al. | 350/381 |
| 5,031,236 | 7/1991 | Hodgkinson et al. | 455/619 |
| 5,034,679 | 7/1991 | Henderson et al. | 324/96 |
| 5,038,102 | 8/1991 | Glasheen | 324/175 |
| 5,110,376 | 5/1992 | Kobayashi et al. | 148/301 |
| 5,113,131 | 5/1992 | Cooper et al. | 324/96 |
| 5,116,693 | 5/1992 | Liu et al. | 428/694 |
| 5,142,227 | 8/1992 | Fish | 342/209 |
| 5,144,846 | 9/1992 | Klauber et al. | 73/862.336 |
| 5,146,790 | 9/1992 | Fish | 73/862.336 |
| 5,150,350 | 9/1992 | Aikoh et al. | 369/112 |
| 5,173,885 | 12/1992 | Iiyori et al. | 369/73 |
| 5,202,629 | 4/1993 | Seike et al. | 324/244.1 |
| 5,214,377 | 5/1993 | Maurice et al. | 324/204 |
| 5,475,489 | 12/1995 | Gottsche | 356/364 |
| 5,483,161 | 1/1996 | Deeter et al. | 324/244.1 |
| 5,493,220 | 2/1996 | Oliver et al. | 324/244.1 |
| 5,631,559 | 5/1997 | Oliver et al. | 324/244.1 |

OTHER PUBLICATIONS

Florczak, J.M., et al., Detecting Two Magnetization Components by the Magneto–Optical Kerr Effect, J. Appl. Phys. 67(12):7520, 15 Jun. 1990, pp. 7520–7524.

Oliver, S. A. et al., Magnetostriction Measurements on Thin Films By A Slot–Line Ferromagnetic Resonance Technique, J. Appl. Physics 67, 5019 (1990) 1 page.

Bucholtz, F. et al., Recent Developments in Fiber Optic Magnetostrictive Sensors, SPIE vol. 1367 Fiber Optic and Laser Sensors VIII, p. 226 (1990) pp. 226–235.

Moog, E. R. et al., Thickness and Polarization Dependence of the Magnetooptic Signal from Ultrathin Ferromagnetic Films, vol. 39, No. 10, 1 Apr., 1989, pp. 6949–6956.

Prinz, G.A., et al., Order–Disorder Effects in he Magneto–Optical Properties of Evaporated Fe–Co Alloy Films, IEEE Transactions on Magnetics, vol. Mag–17, No. 6, Nov. 1981, pp. 3232–3234.

Krebs, J. J. et al., Applications of Magneto–Optics in Ring Laser Gyroscopes, IEEE Transactions on Magnetics, vol. Mag–16, No. 5, Sep. 1980, pp. 1179–1184.

Freiser, Marvin J., A Survey of Magnetooptic Effects, IEEE Transactions on Magnetics, vol. Mag–4 No. 1, Jun. 1968 pp. 152–161.

Oliver, S.A. et al., Research in Microwave and Magneto–Optic Materials, Nov. 1991, Industrial Advisory Report to CER Members.

McKnight, S.W. et al., Research in Microwave Materials, May 1991 Industrial Advisory Board.

Oliver, S.A. et al., Research in Microwave Materials, Nov. 1990 Industrial Advisory Board Report.

McKnight, S. w. et al., Magneto–Optical Kerr Effect in Soft Magnetic Films For Optical Sensor Applications, Proposal to Charles Stark Draper Laboratories, Mar. 10, 1990 pp. 1–7.

Moslehi, B et al., Optical Magnetic and Electronic Field Sensors Based On Surface Plasmon Polariton Resonant Coupling, Mar. 25, 1991.

Vijai Kumar Agrawal, et al, Waveguide Type Optical Modulator Using Kerr Magnetooptic Effects in Ni–Fe Thin Films; Experimental Study Japanese Journal of Applied Physics, vol. 14, No. 9, Sep., 1975, pp. 1313–1322.

V. K. Agrawal, et al, Analysis of Hybrid Modes in an Optical Waveguide Gounded at One Side by A Gyromagnetic Medium, Optics Communication, vol. 16, No. 1, Jan., 1976, pp. 104–109.

Mark E. Re, et al, Magneto–Optic Determination of Magnetic Recording Head Fields, IEEE Transactions on Magnetics, vol. Mag–22, No. 5, Sep., 1986, pp. 840–842.

C. S. Guderman, D.E., et al, "Easy Axis Orientation Mapping of Soft Magnetic Films Using a Magnetic–Optic Kerr BII Image," IEEE Transactions on Magnetics, vol. 25 No. 5, Sep., 1989, pp. 4207–4209.

K. Abe, et al. HC Measurement of Microscopic Regions on Thin Film Magnetic Disc Using Longitudinal Kerr Effect, IEEE Transactions on Magnetics, vol. 25, No. 5 Sep., 1989, pp. 4210–4212.

Steven A. Oliver, et al., Magnetic Field Measurements Using Magneto–optic Kerr Effect Sensors, Optical Engineering, Nov. 1994, vol. 33 No. 11, pp. 3718–3722.

S. A. Oliver, et al., Measurement of Magnetic Fields Using the Magnetooptic Kerr Effect, Applied Physics Letter 63 (3) Jul. 19, 1993 pp. 415–417.

Richard LAO, Space Electronics, Inc., A New Wrinkle in Magnetoresistive Sensors, Sensors Oct., 1994 pp. 63–65.

S. A. Oliver, et al. Magnetic Kerr Effect Sensors for Fiber Optic Applications, SPIE vol. 2070 Fiber Optic Laser Sensors XI (1993) pp. 429–437.

METHOD AND APPARATUS FOR PERFORMING MAGNETIC FIELD MEASUREMENTS USING MAGNETO-OPTIC KERR EFFECT SENSORS

This application is a continuation of U.S. patent application Ser. No. 08/474,692, filed Jun. 7, 1995, now U.S. Pat. No. 5,631,559 which is a continuation in part of U.S. patent application Ser. No. 08/026,589, filed Mar. 5, 1993, now U.S. Pat. No. 5,493,220.

FIELD OF THE INVENTION

This invention relates to transducers and more particularly to magneto-optic transducers.

BACKGROUND OF THE INVENTION

As is known in the art, a transducer is a device or apparatus that converts non electrical physical parameters into electrical signals (i.e. current or voltage signals) having a value proportional to the value of the physical parameter being measured. Typical transducers provide a variation in an electrical resistance, inductance, or capacitance in response to a change in some physical parameter to be measured.

For example, a strain gauge may be provided by disposing a foil or wire in a region in which strain is to be measured. The electrical wire or foil is provided from a piezoresistive material. Thus, a change in the length and or cross-sectional area (i.e. mechanical deformation) of the foil or wire produces a change in the electrical resistance of the foil or wire.

The resultant change in electrical resistance of the foil or wire corresponds to a particular strain. A corresponding electrical signal is subsequently fed via an electrical line, for example, from the foil or wire to a detector and electronics where the signal is detected and processed to provide an indication of the corresponding level of strain. Thus, by measuring the change in resistance of the foil or wire to a calibration level of the strain gauge, the strain within the region to which the strain gauge is attached may be determined.

One problem with this approach however, is that electrical signal paths are subject to sources of noise which in some applications render the measurement system unusable. Furthermore, in those applications in which electrical based devices are disposed in potentially explosive environments such electrical based devices may be hazardous to use.

SUMMARY OF THE INVENTION

In accordance with the present invention, a magneto-optic sensing system includes a light source for emitting a light and a first polarizer or polarizing element, disposed to intercept at least a portion of the emitted light, and for allowing light having a first predetermined polarization characteristic to pass therethrough. The sensing system further includes a magneto-optic sensing element, disposed to intercept and direct a portion of the light having the first polarization characteristic, a second polarizer or polarizing element, disposed to receive at least a portion of the light directed thereto from the magneto-optic sensor element and adapted to attenuate the intensity of light having the first polarization characteristic and a detector disposed to detect light having an intensity, a phase and a polarization provided by the first polarizer, the sensing element and the second polarizer. With this particular arrangement, a magneto-optic sensing system is provided. If the magneto-optic sensor element is provided as a magnetic field sensing element, then the magneto-optic sensing system may be provided as a magneto-optic magnetic field sensing system. On the other hand, if the magneto-optic sensor element is provided as a stress sensing element, then the magneto-optic sensing system may be provided as a magneto-optic stress sensing system. The magneto-optic sensing element may be provided from one or more layers of a ferrimagnetic or ferromagnetic material. Depending on the particular application, each of the magnetic layers may be provided having a relatively large or a relatively small magnetoelastic coupling characteristic and a particular saturation magnetostriction. Thus in those applications where the sensor element is disposed to provide a magnetic field sensor it would be desirable to provide the magnetic layers having a small saturation magnetostriction characteristic. On the other hand, in those applications in which the sensor element is disposed to provide a stress sensor, it would be desirable to provide the magnetic layers having a large saturation magnetostriction characteristic.

In accordance with a further aspect of the current invention, a sensor includes a flux concentrator which may be disposed about a magnetic field sensing element. With this particular arrangement, a sensor having a relatively high degree of sensitivity is provided. The sensor element may be provided as a magnetoresistance sensor, a magneto-optic sensor, or any other thin film sensor which is responsive to the application of a magnetic field in the plane of the sensor. The flux concentrator may preferably be provided from a thick multidomain film of a high permeability ferromagnetic element or alloy. The flux concentrator is provided having a shape such that the magnetic field flux lines around the flux concentrator are rerouted through the flux concentrator. Furthermore, the shape of a flux concentrator is provided such that the concentrated magnetic field flux lines emerge from the flux concentrator in such a fashion such that the sensor is immersed in an enhanced, uniform magnetic field. The flux concentrator may be planar or three dimensional, and may be provided by techniques including but not limited to thin film deposition techniques and machining. The particular shape of the flux concentrator may be dependent upon the particular application, and may be determined by well known magnetostatics calculation techniques. The net enhancement in the magnetic field at the sensor location, relative to the ambient magnetic field, will be determined by factors including but not limited to the size and shape of the flux concentrator, and the permeability of the constituent element or alloy which provide the flux concentrator and the sensor. The flux concentrator may be used in those magneto-optic magnetic field sensor applications requiring a high degree of sensitivity. In such applications the flux concentrator may be provided from a high permeability film such as an iron-nickel alloy. In this case, the presence of the flux concentrator increases the sensitivity of a measurement system by increasing the total magnetic field strength at the sensing element location relative to the ambient magnetic field environment.

In accordance with a still further aspect of the invention, a sensor includes a magnetic shield disposed about a stress sensing element. The magnetic shield is provided for minimizing extraneous magnetic field lines from a plane in which the sensing element is disposed. With this particular arrangement, a stress sensing element is provided. The magnetic shield may be provided from a relatively thick film of a ferromagnetic element or alloy having a relatively high permeability. The magnetic shield may be provided having a shape selected to direct external magnetic fields away from the sensor and to minimize magnetic fields at the sensing element arising from surface magnetic poles in the magnetic shield.

In accordance with a still further aspect of the present invention, a system for measuring the rotational speed of a rotating member includes a magnet coupled to the rotatable member, a light source, a sensing film disposed proximate the rotatable member such that the sensing film is exposed to a magnetic field generated by the magnet, a polarizing beamsplitter disposed between the light source and the sensing film, a mirror disposed to intercept and reflect light directed thereto from a first surface of the sensing film and a detector disposed to intercept light reflected off the polarizing beamsplitter. With this particular arrangement, a system for detecting a switching magnetic field is provided. The polarizing beamsplitter intercepts light provided by the light source and reflects light having a first polarization and passes light having a second polarization to the sensing film. The light having the second polarization then reflects off a first surface of the sensing film and undergoes a polarization conversion. The light is reflected from the sensing film toward the mirror. The mirror reflects the light back towards the sensing film. The light reflects off the sensing film thus undergoing additional polarization conversion and then reaches the polarizing beamsplitter. The polarizing beamsplitter directs light incident thereon to the detector. The light reflected from the polarizing beamsplitter to the detector includes a first signal component corresponding to the light initially having the second polarization and which has undergone polarization conversion due to reflection off of the sensing film and a second signal component having the first signal polarization. The second signal component corresponds to a signal component which has leaked through the polarizing beamsplitter and thus has an amplitude which is relatively small compared with the amplitude of the first signal component. The detector combines the first and second signal components in a manner corresponding to the summation of the respective electric field amplitudes and phases. The detector provides an information-containing output current signal having an amplitude which is proportional to the amplitude of the polarization converted light. In one embodiment, the amplitude of the output current signal is linearly proportional to the amplitude of the polarization converted light. The amplitude of the information-containing output signal current is larger than the amplitude of a corresponding information-containing output signal generated when the first polarization light amplitude is zero. Using this method the detector current also contains a relatively large information-independent component and a negligible information-containing component that is quadratic in the polarization converted light amplitude. The sensing film is disposed such that when the magnet is placed in a predetermined position relative the sensing film, an easy axis of the sensing film is aligned in a direction which is collinear with the direction of the magnetic field of the magnet. The sensing film magnetization M will then lie in a direction which is either parallel or anti-parallel to the direction of the magnetic field generated by the magnet coupled to the rotating member. The direction of the magnetization vector M reverses (i.e. change from the anti-parallel direction to the parallel direction) if the magnitude of the magnetic field exceeds a critical value determined by the value of the coercive magnetic field of the sensing film. The magnetization vector M can thus track a switching magnetic field as long as the magnitude of the magnetic field exceeds the threshold established by the value of the coercive magnetic field of the sensing film. The switching performance is independent of the rate at which the magnetic field switches. Furthermore, the effects of magnetic noise can be mitigated by using sensing films which have a relatively large coercive magnetic field. The magnetization switching is converted to an optical signal by orienting optical components (i.e. the light source, the polarizing beamsplitter and the mirror) such that the sensing film easy axis lies in the light plane of incidence. Then the presence of a magnetization vector M having a predetermined amplitude will cause polarization conversion in the reflected light, in a manner which may be computed in accordance with the longitudinal magneto-optic Kerr effect. The amount of polarization conversion depends in part on the optical and magneto-optical properties of the sensing film and the power of the light source. In such an embodiment, the amount of polarization conversion is held approximately constant. The direction of light polarization rotation (polarization conversion), i.e. clockwise or counter-clockwise solely depends upon the orientation of the magnetization vector M. Thus, when the direction of the magnetization vector M changes, the light rotation reverses from clockwise to counter-clockwise or vice versa. The direction of light rotation appears after light mixing at the detector in the sign of the predominate component of information-containing current. For example, a clockwise rotation may correspond to a positive current flow (or vice versa), in which case a counter-clockwise rotation would yield the opposite current flow sign. Thus using this method the switching of the magnetization vector M is detected by the detector as a reversal of a fixed amount of current flow. A plurality of magnets may be coupled to the rotating member to allow the position of rotating member to be determined precisely. A signal generating circuit can be coupled to the detector to generate a series of discrete signal pulses which can be used to indicate the position of the rotating member. Such a system may be adapted for measuring the rotational speed of shaft driven machinery. For example, such systems may adapted for use in tachometer systems.

In accordance with a still further aspect of the present invention, a high field magneto-optic Kerr effect magnetic field sensing system includes a light source and a polarizing beamsplitter disposed to intercept light provided from the light source. The polarizing beamsplitter predominately reflects light having a first light polarization and predominately passes light having a second polarization. The light which passes through the polarizing beamsplitter is incident on a first surface of a sensing film at a normal or near-normal angle. The sensing film is disposed such that the direction of an external magnetic field to be measured is normal to the first surface of the sensing film. At least a portion of the light incident on the first surface of the sensing is reflected from the sensing film back toward the polarizing beamsplitter. A component of the reflected light will undergo polarization conversion, as described by the polar magneto-optic Kerr effect. The amount Of polarization conversion will depend in part on the optical and magneto-optical properties of the sensing film element, the light source power, and the ratio of the external magnetic field to the film demagnetizing field, where both are taken along the sensing film normal. For example, for single layer, soft magnetic films having relatively small thickness to width ratios (typically less than 0.001) i.e. a ratio such that a magnetizing field normal to the film is within about 5% of the effective magnetizing field. The film demagnetizing field approximates the film effective saturation magnetization, which can range from 2,000 Gauss (G) to over 23,000 G. Since the film parameters and light source energy can be predetermined, the amount of light polarization conversion will vary linearly with the magnitude of the external magnetic field, until it exceeds the film demagnetizing field, where the sensing system will be saturated. Light reflected toward the polarizing beamsplitter from the sensing film will again have the second polarization predominately passing through with the remnant of the first polarization and the polarization converted light being predominately reflected to the detector. These light components mix at the detector, as given by the sum of their electric field amplitudes and phases, yielding an information-containing current that is linearly proportional to the external magnetic field, a negligible information-containing current that is quadratic in the external magnetic field, and a signal-independent offset current. With this particular arrangement, a system for accurately measuring magnetic field strengths is provided. The sensing system may be employed in a magnetometer used in magnetic resonance imaging apparatus for example. The plane in which the first surface of the sensing film lies is normal to the direction of the light incident thereon. In one embodiment a fiber optic cable has a first end coupled to the polarizing beamsplitter and a second end coupled to said sensing film. The sensing film may be disposed directly on the second end of the fiber optic cable to thus provide a reliable, low cost sensor system. Increased sensitivity is achieved in this system due to the relatively large polar Kerr effect reflection coefficient as opposed to the reflection coefficient due to the longitudinal Kerr effect.

BRIEF DESCRIPTION OF THE DRAWINGS

The foregoing features of this invention as well as the invention itself may be more fully understood from the following detailed description of the drawings in which.

DESCRIPTION OF THE PREFERRED EMBODIMENTS

Figure 1:
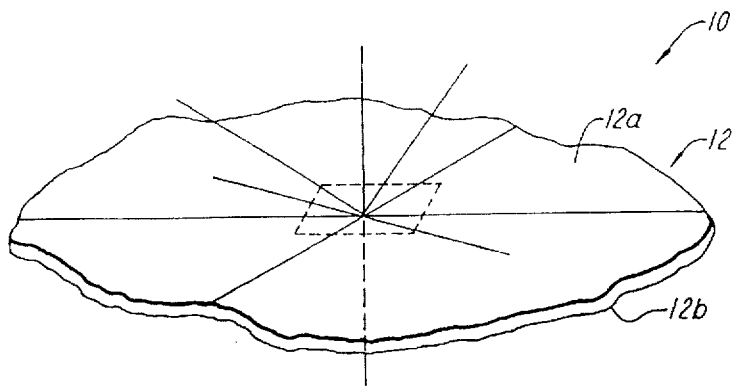
FIG. 1 is an isometric view of a magneto-optic sensing element.

Referring now to FIG. 1, a magneto-optic sensing element 10 is provided as a magnetic thin film 12 having first and second opposing surfaces 12a, 12b. The magnetic thin film 12 is here provided from a single layer of a ferromagnetic or ferrimagnetic material having a thickness typically in the range of about 5 nanometers (nm) to 500 nm.

The magnetic layer 12 may be provided such that the total magnetic free energy of the layer is anisotropic with respect to the orientation of the magnetization vector in the layer plane. This anisotropic total magnetic free energy dependence on magnetization orientation can be described by assuming the presence of a (fictitious) in-plane uniaxial anisotropy field. Here the magnetic layer may be provided with a small, spatially homogeneous in-plane uniaxial anisotropy.

The presence of the in-plane uniaxial anisotropy field defines an axis along which a magnetization vector of the magnetic layer 12 lies prior to the application of an external stimuli to be measured. This axis is generally referred to as a so-called "easy axis." Orthogonal to the easy axis is a so-called "hard axis" along which the total magnetic field free energy is maximized, such that it is most energetically unfavorable for the magnetization to lie along the hard axis. The direction of the magnetization vector should not deviate from the easy axis unless external stimuli are applied to the magnetic layer 12 at an angle relative to the easy axis as will be described further below and in conjunction with FIGS. 3 and 7–9.

The magnetic layer 12 is provided having a particular thickness selected such that a demagnetizing and if present uniaxial anisotropy field perpendicular to the film plane confine the film magnetization into the plane of the film 10. The magnetic layer 12 should also be provided such that should domain walls exist in the layer 12, they should preferably be confined to regions exterior to the section of the layer 12 upon which light is incident.

The orientation of the magnetization in the plane of the magnetic layer is responsive to application of external magnetic fields in the film plane, such that the film 10 may be disposed to provide a magnetic field sensor, for example. The orientation of the magnetization is also responsive to the application of planar stress through either film surface 12a, 12b, such that the film 10 may be disposed to provide a stress sensor. Such stress may include but is not limited to strain, torque and pressure.

If other film characteristics (e.g. magneto-optic constant, reflectivity, magnetostriction constant, film thickness, film composition, etc. . . . ) are provided having predetermined values, the amount of rotation of the magnetization in the film plane with a fixed applied stimuli (magnetic field, stress, strain, torque, pressure, etc. . . ) depends upon the magnitude of the in-plane uniaxial anisotropy in the magnetic layer and the angle at which the stimuli is applied relative to the easy axis. The sensitivity of the sensor depends upon the degree of magnetization rotation for an incremental change in applied stimuli. Thus, a trade off may be made between sensor sensitivity and the range of a particular quantity which may be measured by the sensor. Such a trade off is made through the selection of a particular in-plane uniaxial anisotropy field.

For example if the film 10 is disposed to provide a magnetic field sensor, and the in-plane uniaxial anisotropy field is provided having a value of ten oersteds (Oe), then magnetic fields having a value greater than ten Oe will saturate a sensor provided from the film 10 and thus may not be measured. It should be noted that the provision of different in-plane uniaxial fields may provide such a sensor having optimum characteristics for different applications.

It would also be desirable for the film 12 to be provided having a large magneto-optic constant at the operational wavelength. A film having a large magneto-optic constant provides relatively large magneto-optic Kerr effects upon reflection of polarized incident light. The sensitivity of an optical detection system (not shown) increases with the magneto-optic constant, if all other film characteristics and stimuli are held constant.

It is further desirable that the reflectivity of the film 10 be large at the operational wavelength, in order to maximize the intensity of the reflected light. As will be described further below, optimizing the total sensitivity of a sensor system may involve trade offs between the film 10 having a high reflectivity and a large magneto-optic constant.

Furthermore, depending on the particular application it may be desirable to provide the magnetic layer 12 having either relatively large or relatively small magnetoelastic coupling characteristics. More importantly, however, is the selection of a magnetic layer having a particular saturation magnetostriction constant.

When the magnetic layer 12 is provided having a relatively small saturation magnetostriction constant a sensing element relatively insensitive to applied planar stress (e.g. strain, torque, pressure) is provided. Thus, in applications where the sensing element is disposed to provide sensitivity to applied magnetic fields as a magnetic field sensor it would be desirable to provide the magnetic layer 12 with a relatively small saturation magnetostriction characteristic typically less than about $10 \times 10^{-6}$.

However, in applications where the sensing element is disposed to provide an indication of external stimuli in the form of planar stress (e.g. strain, torque, or pressure), it is desirable that the magnetic layer 12 have a relatively large saturation magnetostriction characteristics typically greater than $25 \times 10^{-6}$. Thus it is desirable that the magnetic layer 12 have large saturation magnetostriction when the sensing element is employed as a stress sensor to sense for example forces such as strain, torque, or pressure.

The magnetic layer 12 may be provided from a combination of iron and boron or alternatively the magnetic layer may be provided from a combination of iron, nickel, boron, and silicon. It should be noted however, that the magnetic layer 12 may also be provided from materials including but not limited to members from the Transition Metal Series, the Lanthanide Series, and Groups III, IV, and V from the Periodic Table of Elements. Preferred elements from which magnetic layers may be provided include iron (Fe), cobalt (Co), nickel (Ni), boron (B), silicon (Si), carbon (C), phosphorus (P), germanium (Ge), nitrogen (N), aluminum (Al), chromium (Cr), copper (Cu), zirconium (Zr), and gadolinium (Gd). Other preferred elements include lanthanum (La), cerium (Ce), yttrium (Y), gallium (Ga), silver (Ag), palladium (Pd), platinum (Pt), gold (Au), vanadium (V), molybdenum (Mo), niobium (Nb), tin (Sn), hafnium (Hf), titanium (Ti), tantalum (Ta), ruthenium (Ru), manganese (Mn), neodymium (Nd), terbium (Tb), dysprosium (Dy), holmium (Ho), samarium (Sm), and europium (Eu).

Figure 1A:
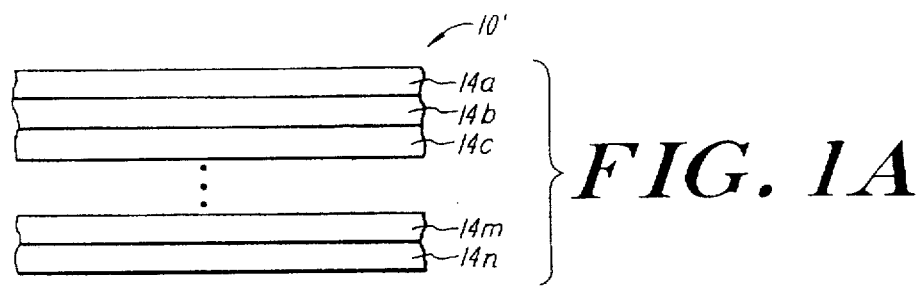
FIG. 1A is side view of a magneto-optic sensing element having a plurality of layers.

Referring now to FIG. 1A, a magneto-optic sensing element 10' is here provided from a magnetic thin film having a plurality of layers 14a–14N. At least one of the plurality of layers 14a–14N should be provided from a ferromagnetic or ferrimagnetic material having a thickness, composition, magnetization orientation, magneto-optic constant, reflectivity, and magnetostriction constant selected in accordance with the parameters discussed above in conjunction with FIG. 1.

The magneto-optic sensing element 10' may be provided such that several layers of magnetic material may be disposed one over another, interspaced by one or more nonmagnetic spacing layers. Here, for example, layers 14a, 14c and 14N may be provided as nonmagnetic layers while layers 14b and 14m may be provided as magnetic layers. Alternatively, layers 14a, 14c and 14N may be provided as magnetic layers and layers 14b, 14m may be provided as non magnetic layers. The nonmagnetic layers are generally provided having a thickness typically in the range of about 1 nm to 400 nm.

Another alternative may be to provide two contiguous layers from magnetic material and provide the remaining layers from non magnetic materials. For example, assuming the sensor 10' is provided having four layers, then layer 14a may be provided from a non magnetic metal, layer 14b may be provided as $Fe_{20}Ni_{80}$, layer 14c may be provided as $Fe_{80}B_{20}$ and layer 14m may be provided as a dielectric material upon which light may be incident.

Each of the layers 14a–14N which are provided as magnetic layers may of course be provided from the elements listed above in conjunction with FIG. 1. The nonmagnetic layers may be provided from metallic, dielectric, or semiconducting materials, selected to enhance the reflectivity of the film, or the adhesion of the film to a substrate (not shown), using techniques well known to those of ordinary skill in the art.

Figure 1B:
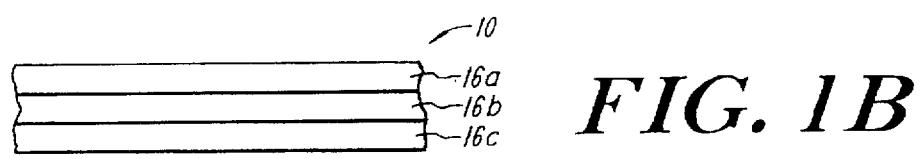
FIG. 1B is a side view of a magneto-optic sensing element.

Referring now to FIG. 1B, a magneto-optic sensing element 10" is provided having an inner magnetic layer 16b disposed between a pair of outer layers 16a, 16c. The outer layer 16a may be provided from a dielectric material and the outer layer 16c may be provided from a dielectric or metal material. The outer layer 16c may be provided from a metal or semi conductor material to dissipate heat energy provided by the magnetic layer 16b for example.

Figure 2:
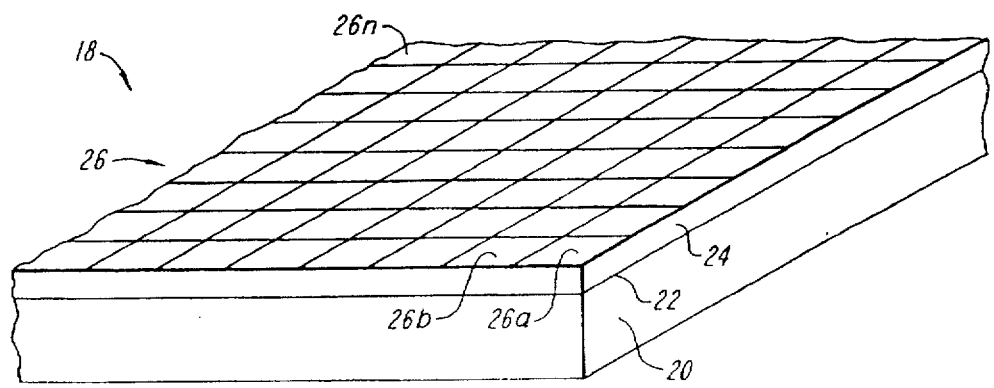
FIG. 2 is an isometric view of a magneto-optic sensing element.

Referring now to FIG. 2, a sensor 18 may be provided as an array 26 of sub-elements 26a–26N provided by dividing a magnetic film 24 into a plurality of disconnected subdivisions, each of such sub-divisions corresponding to one of the sensor sub-elements 26a–26N. The magnetic film 24 may be provided as a single layer film or a multilayer film as described above in conjunction with FIGS. 1–1B.

The sub-elements 26a–26N are preferably provided having planar disc or elliptical shapes. However rectangular or other shapes may also be used as long as no demagnetizing fields are generated which affect the desired magnetization behavior described above in conjunction with FIG. 1. Furthermore, the sub-elements need not be of equal size.

Here, the sub-divided film is shown disposed on a first surface 22 of a substrate 20. The substrate 20 may be provided from any material such as glasses, transparent dielectrics, plastic, metal, semiconductor materials and any other material well known to those of ordinary skill in the art. The film 24 and thus the sensing element 18 may be disposed over the substrate 34 using conventional deposition, patterning and lithographic techniques. The substrate 20 may correspond to a device under test, or alternatively the substrate 20 with the film 24 disposed thereon may be mounted on a device under test or at a position under test.

The sensors 26 may be conformally disposed on a surface having a predetermined shape. Thus, although the film 24 is here shown disposed over a substrate 20 having a flat surface, the substrate 20 could alternatively have been provided having a curved surface over which the film 26 may be disposed. The film 26 may be disposed over such a curved surface provided that the film retains the characteristics of having good adhesion to the substrate, uniform anisotropy fields and demagnetizing fields which confine the film magnetization in the film plane and with a homogeneous predetermined magnetization orientation throughout the film 26, and a uniform response to the external stimuli. Thus, regardless of the shape of the surface on which the film 26 is disposed the magnetization should be oriented such that the sensor 18 provides substantially the same response everywhere on the sensing element for a uniform stimulus. These conditions are also desirable when the sensor film 26 is provided as a non-subdivided film 10 as shown in FIG. 1.

Figure 3:
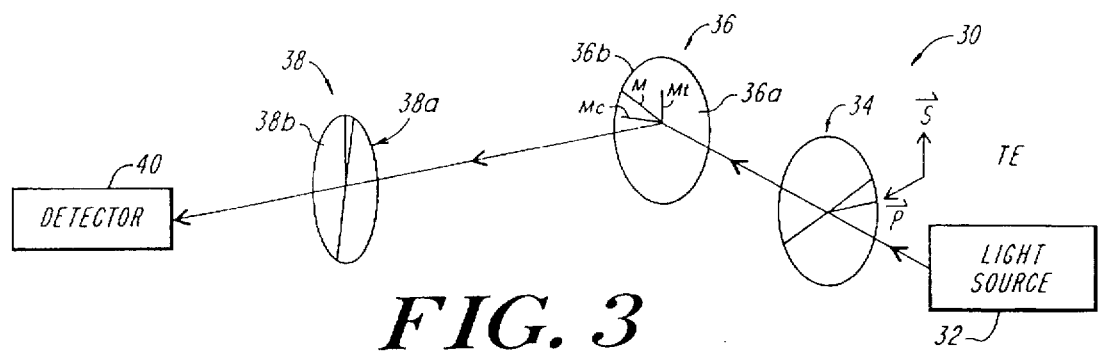
FIG. 3 is a schematic diagram of a magneto-optic sensing system.

Referring now to FIG. 3, a magneto-optic sensing system 30 includes a light source 32 which may be provided, for example, as a helium-neon (HeNe) laser operating at 0.63 microns, a laser diode, a light emitting diode, or any other quasi-monochromatic light well known to those of ordinary skill in the art. The light source 32 emits light which is transmitted toward a first surface of a polarizer 34 which allows light having a first predetermined polarization to pass therethrough.

The light which passes through the polarizer 34 is thereafter incident upon a sensing element 36 which may be provided as a magnetic field sensing element or a stress sensing element in accordance with techniques described above in conjunction with FIG. 1. The sensing element 36 is provided having first and second opposing surfaces 36a, 36b. The polarized light is incident on the first surface 36a of the sensing element 36.

The incident light preferably illuminates a single magnetic domain (not numbered) of the sensing element 36. At least a portion of the light is then reflected from the surface of the sensor film towards a first surface 38a of a second polarizer 38.

The polarizer 38 is here adapted to attenuate the intensity of light having the first polarization characteristic. The polarization characteristics, denoted as either transverse electric polarization (s-polarized light) or transverse magnetic polarization (p-polarized light), are defined by the orientation of the light plane of incidence relative to the plane of the sensing element 36. Light which is reflected off of the sensing element 36 may have a rotation of polarization relative to the incident light. This rotation of polarization effectively converts a fraction of one polarization to the other by an amount given by the off-diagonal elements of the Jones matrix for the sensing element 36. The amount of polarization conversion is dependent upon the orientation of the magnetization in the magnetic layer or layers relative to the plane of incidence of the transmitted beam from the first polarizer 34 to the sensing element 36. Thus light having an intensity, a phase and a polarization provided by the first polarizer 34, the sensing element 36 and the second polarizer 38 is transmitted to a detector 40.

The detector 40 may be provided as a semiconductor diode, a photomultiplier tube or as any other type of detector well known to those of ordinary skill in the art.

The transmission of light from the light source 32 to the detector 40 may be through the atmosphere, or alternatively through guided wave media or alternatively still through a combination of the atmosphere and guided wave media. Such guided wave media may be provided for example as a fiber optic cable, or a channelled optical device. Requirements on the transmission characteristics (e.g. polarization maintaining, single mode, multimode, etc...) of the guided wave media should be selected in accordance with the particular application desired and the section of the transmission path which the guided wave media would provide.

The dependence of the system sensitivity on the polarization characteristics of light may be more easily explained by considering a special case in which only one polarization component is incident upon the sensing element 36. The first polarizer 34 may thus be adjusted such that only light having a transverse electric field (TE or s-polarized light) component is incident on the sensing element 36.

The polarization characteristics for light specularly reflected from the sensing element 36 may be analytically determined by applying the so-called Jones matrix for the sensing element 36 to the analogous matrix for the initial polarized light. The Jones matrix allows a full description of the optical response of the sensing element 36, including the Kerr magneto-optic effects.

Continuing the special case, if the component of the magnetization vector for the magnetic film layer(s) (not shown) that lies in the plane of incidence of the light is non-zero, a small component of the incident s-polarized light will be converted to p-polarized light (transverse magnetic or TM) upon reflection. If the second polarizer 38 is then adjusted such that only p-polarized light is permitted transmission, a non-zero light intensity will be measured at the detector 40. This configuration of polarizer orientations is generally referred to as "crossed polarizers".

Thus the amount of polarization conversion, and hence detector signal, is proportional to the magnitude of the magnetization component in the plane of incidence. Since the magnetization component depends upon the magnitude and orientation of the uniaxial anisotropy in the magnetic layer(s) of the sensor 36, and the orientation and magnitude of the external stimuli, this procedure forms the basis of the sensor system 30.

The signal to noise ratio of the sensor system 30 may be increased by using a homodyne coherent detection scheme. Such a detection scheme may be employed through adjustment of the orientations of the two polarizers 34, 38 relative to the "crossed polarizer" settings described above. The first polarizer 34 is adjusted such that it transmits primarily one polarization, but with a small "leakage" component of the second polarization. Upon reflection from the sensing element 36 the amplitude and phase of both light polarizations will be modified in a manner defined by the Jones matrix for the sensing element 36, which includes the orientation of the magnetization in the magnetic layer(s) relative to the plane of incidence of the light. At this point a mixing of electric field amplitudes occurs between the small signal amplitude converted from the primary polarization component and the polarization component "leaked" through the first polarizer 34. This "leakage" electric field amplitude provides the local oscillator signal in the homodyne coherent detection scheme, providing a net gain in signal intensity at the detector 40.

Conventional homodyne sensors use two separate optical paths. In the present invention signals having both polarizations follow the same optical path. Sources of external noise which affect one polarization component will similarly affect the other component, so as to minimize the total noise contributions along the optical path. This results in a signal having a greater signal-to-noise ratio than a signal provided by the "crossed polarizer" implementation. For all implementations the signal-to-noise ratio increases with increasing light source optical power at the operational wavelength. There are also few constraints on the coherence of the source 32.

Figure 4:
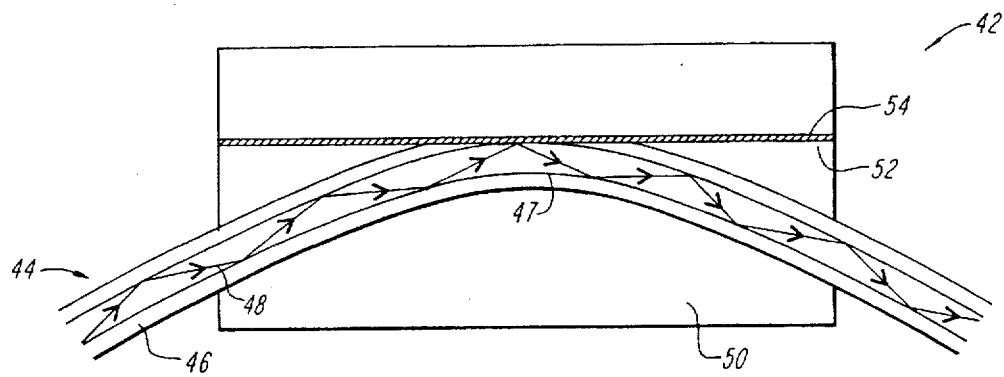
FIG. 4 is a sensor which may be of the type used in the sensing systems of FIGS. 7 and 9-11.

Referring now to FIG. 4, light 48 incident on a sensing element 52 is propagated through a fiber optic cable 44. The cable 44 is here disposed on a dielectric block 50 to provide a so-called fiber optic coupler block half 42. A portion of the fiber optic cable cladding 46 has been removed to expose a fiber optic cable core 47 at the apex of curvature such that at least a portion of the light 48 propagating through the fiber optic cable 44 may be exposed to the sensing element 52 which has been disposed on either the fiber optic coupler block half 50 containing the fiber, or the opposing coupler block half 54 which is placed surface to surface with the coupler half 50 containing the fiber optic cable 44. In either case the coupler block half which has the sensing element 52 disposed thereon is considered the substrate, and the area of the sensing element 52 exposed to the light should remain single domain during standard sensor operating conditions.

Figure 5:
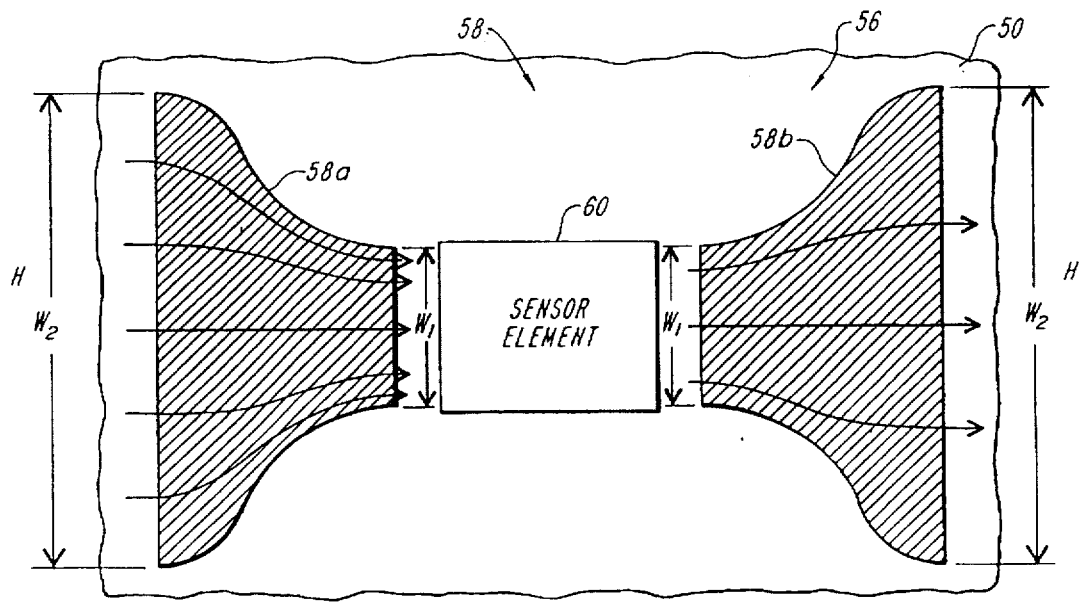
FIG. 5 is a sensor including a flux concentrator disposed about a sensing element.
Figure 5A:
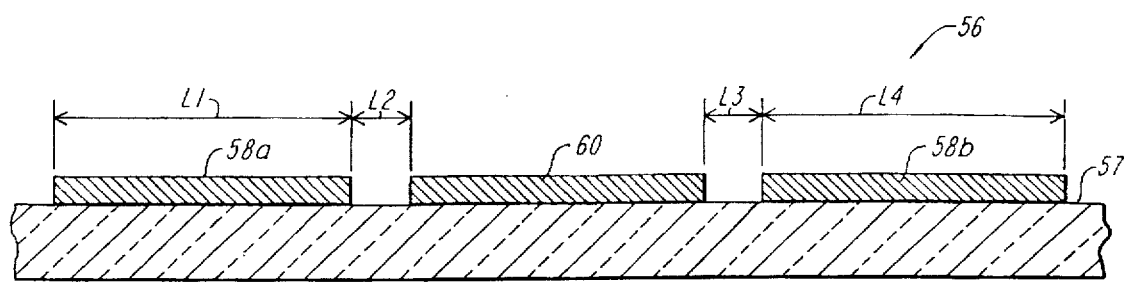
FIG. 5A is a cross sectional view of the sensor of FIG. 5.

Referring now to FIGS. 5 and 5A, a sensor 56 includes a flux concentrator having portions 58a, 58b generally denoted 58 disposed about a magnetic field sensor element 60. The sensor 60 may be provided as a magnetoresistance sensor, a magneto-optic sensor or any other sensor responsive to the application of a magnetic field in a plane in which the sensor 60 is disposed. The flux concentrator 58 is preferably provided from a multidomain film having a thickness typically in the range of about 0.5 microns to 10 microns.

The film should include at least one layer provided from a ferromagnetic element or alloy having a relative permeability typically in the range of about 200 to 5000.

The flux concentrator 58 is provided having a shape such that the magnetic field flux lines around the flux concentrator 58 are directed through the flux concentrator 58. Furthermore, the shape of the flux concentrator 58 may be selected such that concentrated magnetic field flux lines emerge from the flux concentrator 58 such that the sensor 60 is immersed in an enhanced, uniform magnetic field. The flux concentrator 58 may be planar or three dimensional, and may be provided by film deposition techniques, machining, or any other technique well known to those of ordinary skill in the art. The particular shape of the flux concentrator 58 may depend upon the particular application, and may be determined by well known magnetostatics calculation techniques. The net enhancement in the magnetic field in the location at which the sensor 60 is disposed, relative to the ambient magnetic field, generally is dependent on the size and shape of the flux concentrator 58, and the permeability and other magnetic parameters of the constituent element or alloy.

The flux concentrator 58 may be advantageous in magneto-optic magnetic field sensor applications requiring a high degree of sensitivity. In such applications the flux concentrator 58 may be provided from a high permeability film such as iron. In this case, the presence of the flux concentrator 58 increases the sensitivity of a system by increasing the total magnetic field strength at the sensing element location relative to the ambient magnetic field environment.

The flux concentrator 58 is here provided having a generally triangular shape with curved side edges as shown. The flux concentrator portions 58a, 58b may be provided having lengths $L_1$, $L_4$ typically in the range of about 1 millimeter (mm) to 50 mm. The lengths $L_1$ and $L_4$ need not be equal. Each of the flux concentrator portions 58a, 58b are spaced from the sensor element 60 by distances $L_2$ and $L_3$ typically in the range of about 0.01 mm to 2 mm. A particular selection of distances $L_1$–$L_4$ may be made based upon a variety of factors including but not limited to the characteristics of the material from which the flux concentrator 58 and the sensor element 60, are made. For example the thickness and permeability characteristics of the material are two factors which may be used to select appropriate values for the distances $L_1$–$L_4$.

The width $W_1$ of the flux concentrator is dependent upon the width of the corresponding side of the sensor element 60. The width $W_1$ is generally provided a minimum of three times the width of the sensor element 60. The width $W_1$ is a function of the length $L_2$ such that the smaller the distance $L_2$, the closer the width $W_1$ becomes to the minimum width of three times the sensor element width. The width $W_2$ is selected to provide a particular gain characteristic for a planar device as shown. Gain is provided as the ratio of $W_2$ to $W_1$.

Figure 6:
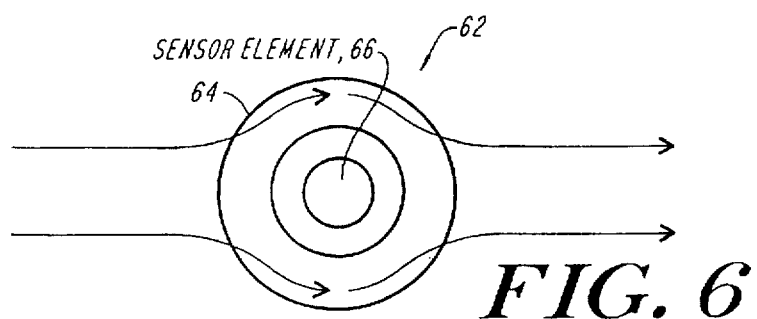
FIG. 6 is a sensor including a magnetic shield disposed about a sensing element.
Figure 6A:
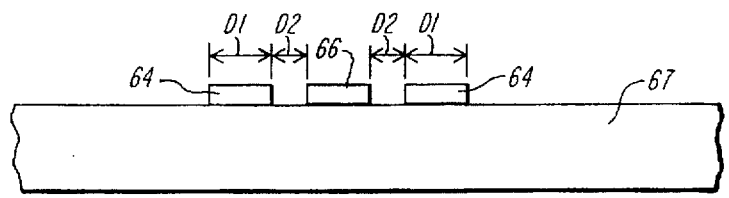
FIG. 6A is a cross sectional view of the sensor of FIG. 6.

Referring now to FIGS. 6 and 6A, a sensor 62 includes a magnetic shield 64 disposed about a sensor element 66 to increase the signal-to-noise ratio of a signal generated in response to a measurement of an applied stress (e.g. strain, torque, pressure, etc...) through the screening of extraneous magnetic field lines from the plane in which the sensing element 66 is disposed. The magnetic shield 64 may not generally screen magnetic fields normal to the plane in which the sensing element 66 is disposed. However, such magnetic fields do not generally affect the magnetization orientation of the magnetic layer(s) in the sensing element unless such fields have a magnitude which is relatively large compared with the magnitude of the demagnetizing field normal to the film layer.

For example, if a magnetic layer of the sensor 66 is provided from Fe and B, the demagnetizing field may be provided having an amplitude typically of about 12,000 Oe. Thus, a significant field normal to the plane in which the sensing element is disposed may have an amplitude typically in the range of 10 Oe to 100 Oe.

The magnetic shield 64 may be provided from a thick film of a ferromagnetic element or alloy having a relative permeability typically in the range of about 200 to 5000. The magnetic shield 64 may be provided having any shape, including but not limited to elliptical shapes other than the circular shape here shown, selected to minimize the effects of any magnetic fields at the sensing element 66 arising from surface magnetic poles of the magnetic shield surface facing the sensor element 66.

The magnetic shield 64 is here provided having an annular ring shape. The shield 64 is provided having a ring width $D_1$ typically in the range of about 0.1 millimeters (mm) to 5 mm and is spaced from the sensor element 66 by a distance $D_2$ typically in the range of about 0.01 mm to 2 mm. A particular selection of distances $D_1$ and $D_2$ may be made based upon a variety of factors including but not limited to the characteristics of the material from which the shield 64 and the sensor element 66, are made. For example the thickness and permeability characteristics of the material are two factors which may be used to select appropriate values for the distances $D_1$ and $D_2$.

Figure 7:
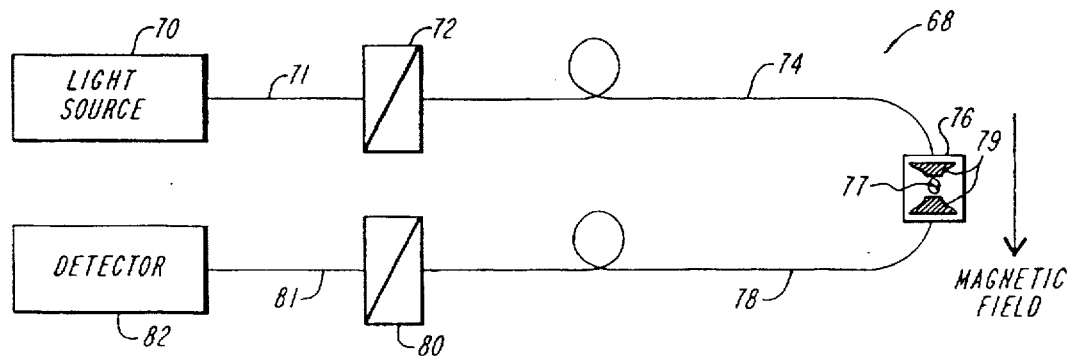
FIG. 7 is a block diagram of a magnetic field measurement system.

Referring now to FIG. 7 a magnetic field measurement system 68 includes a single optical path between a light source 70 and a detector 82. The system 68 is here provided using fiber optic and other guided wave components. The system includes a light source 70 which transmits light along a first fiber optic cable 71 to a first polarizer 72. The polarization of the light transmitted through the first polarizer 72 is determined by the detection scheme to be applied and the desired signal-to-noise ratio. Polarized light is coupled from the polarizer 72 through a fiber optic cable 74 and is incident upon a sensor 76. The sensor 76 includes a sensor element 77 which may be disposed on a fiber optic coupler block half in the manner described above in conjunction with FIG. 4.

The sensor 76 may optionally include flux concentrators 79, as described above in conjunction with FIG. 5, disposed about the sensor element 77 to enhanced sensitivity to a magnetic field. The coupler block half/substrate/sensing element sensor 76 has been previously positioned on the object or at the location where the external magnetic field is to be measured, such that the magnetic field lies in the plane of incidence of light and in the plane of the sensing element 77.

In this embodiment it is desirable that there be no polarization conversion when the external magnetic field is zero. This may be accomplished by providing the sensing element 77 such that the hard axis of the magnetic layer(s) which provide the sensing element 77 lies in the plane of incidence of light, such that the magnetization lies transverse to the plane of incidence when no external stimuli is present. This arrangement provides the desired result since there is no magnetization vector component in the light plane of incidence, and hence no polarization conversion.

As described above, the magnetic layers which provide the sensor element 77 may be provided having small saturation magnetostriction constants such that the effects of external stress (strain, torque, pressure) do not cause a change in the orientation of the magnetization vector. The predetermined orientation of the sensing element 77 and plane of light incidence is such that the external magnetic field to be measured is oriented predominately along the axis defined by the plane of incidence and the film plane (which is also along the axis defined by the maximum in-plane uniaxial anisotropy field, the so-called "hard" axis).

The presence of an external magnetic field oriented along the "hard" axis will cause a rotation of the magnetization in the magnetic layer(s) towards the "hard" axis, by an amount determined by the magnitude of the external magnetic field and the magnitude of the in-plane uniaxial anisotropy field. This magnetization rotation causes a change in the optical properties of the sensing element 77, as described by the Jones matrix.

In particular, this arrangement is such that no polarization conversion occurs when the magnetization lies transverse to the "hard" axis, i.e. when the external magnetic field is zero. This case corresponds to the transverse magneto-optic Kerr effect. On the other hand, a maximum amount of polarization conversion occurs when the magnetization lies along, or close to, the "hard" axis, corresponding to the so-called longitudinal magneto-optic Kerr effect. Hence the rotation in magnetization orientation caused by the presence and magnitude of the external magnetic field produces a change in the polarization characteristics of the reflected light from the sensing element.

Magnetic flux concentrators 79 may also be employed so as to increase the magnetic field at the sensing element location relative to the ambient magnetic field. This will enhance the amount of magnetization rotation and hence the total polarization conversion.

Light specularly reflected from the sensor 76 is transmitted along a fiber optic cable 78 to a second polarizer 80. As mentioned above, in conjunction with the crossed polarizer and the optical homodyne coherent detection, the light transmitted through the polarizer 80 is modified according to the application and the detection scheme employed.

Light transmitted through the second polarizer 80 is then coupled along a fiber optic cable 81 to a detector 82. The optical detector 82 converts the total optical power to a detector current. The detector current may then be modified through amplification, phased loop lock detection, etc. or through other electronics techniques well known to those of ordinary skill in the art. Finally, the modified current is presented in such a form that the external magnetic field at the sensor location may be determined.

It should be noted that the particular embodiment of the magnetic field sensor system 68 may be equally well implemented for the measurement of stress (strain, torque, pressure) by replacing the magnetic field sensing element 77 with a stress sensing element 77', eliminating the optional flux concentrator 79 and adding a magnetic shield 79' if desired. An example of what such an element would entail is described below in conjunction with FIG. 8.

Figure 8:
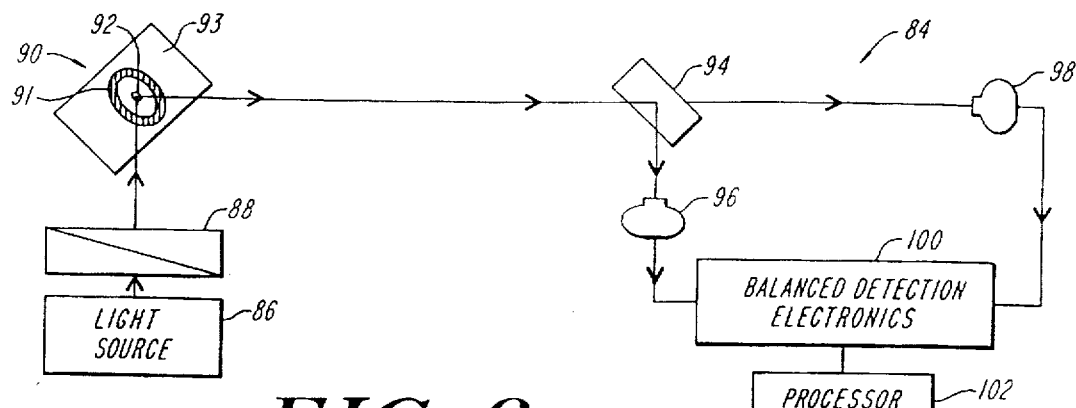
FIG. 8 is a block diagram of a magneto-optic stress sensing system.

Referring now to FIG. 8, a magneto-optic stress (e.g. strain, torque, pressure, etc. . . ) sensing system 84 includes a light source 86 which directs a light beam toward a polarizer 88. The light source 86 and polarizer 88 may be similar to the light source and polarizer described above in conjunction with FIGS. 3 and 7.

Here, light having a predetermined polarization defined by polarizer 88 is incident upon a sensor 90. The sensor 90 here includes an optional magnetic shield 91 disposed about a stress sensing element 92. The sensor 90 is here diagrammatically shown in perspective view to more easily view the magnetic shield 91 and sensing element 92. In practice of course the sensor 90 should be disposed such that the sensing element appropriately reflects light fed from the polarizer 88 toward polarizer 94.

The sensing element 92 (and optional magnetic shield 91 if provided) has been previously deployed on an object 93 or at the location under test. The sensing element 92 (and magnetic shield if present) may have been provided on the object through thin film deposition techniques. Alternatively, the sensing element 92 (and magnetic shield if present) may be mounted on the object 93 using adhesives having sufficient strength and stiffness such that the stress (strain, torque, pressure) is transferred as accurately as possible from the test object 93 to the sensing element 92 and any corresponding substrate. Well known techniques and adhesives used for mounting strain gauges may be employed in the mounting of the stress (strain, torque, pressure) sensing element 92 and substrate.

The sensing element 92 is provided from magnetic layer (s) having a relatively large saturation magnetostriction constants typically in the range of about $25 \times 10^{-6}$ to $60 \times 10^{-6}$. In those applications where the desired stimuli to be measured is uniaxial stress or the analogous strain, torque, or pressure stimuli, the sensing element 92 may be provided by locating the "hard" axis of the magnetic layer(s) at a 45 degree angle relative to the light plane of incidence. The magnetization orientation, for no applied external stimuli, will thus lie transverse to the "hard axis" and also at 45 degrees relative to the light plane of incidence. For this case the sensing element 92 is positioned such that the uniaxial stress lies in the light plane of incidence. Application of external tensile (compressional) stress along this axis will create another in-plane uniaxial anisotropy field through the so-called inverse magnetostriction effect, causing a rotation of the magnetization towards or away from the light plane of incidence by an amount dependent upon the external uniaxial stress, the saturation magnetostriction constant of the magnetic layer(s), and the in-plane uniaxial anisotropy. Thus, providing the magnetic layer(s) with predetermined uniaxial anisotropy and saturation magnetostriction constants will determine the amount of magnetization rotation for an incremental change in stress (strain, torque, pressure) transferred from the object to be measured to the sensing element.

Light reflected specularly from the sensing element 92 is transmitted to a polarization splitter 94, which allows at least a portion of the incident light to pass therethrough, and reflects the remaining light. The polarization splitter 94 is oriented so as to mix primary and signal containing polarizations of the light signal in a predetermined manner. The primary polarization corresponds to the light polarization which is predominantly transmitted through the first polarizer 88. The signal containing polarization corresponds to the light polarization which is predominantly not transmitted through the first polarizer 88. The signal polarization also includes light which is converted from the primary polarization to this second polarization. Thus after mixing, each of the two light beams contains some signal information.

Each beam is transmitted to a respective one of detectors 96, 98, and converted to a detector current using any technique well known to those of ordinary skill in the art. The detector currents, each containing signal information, are then combined in a balance electronics circuit 100 in a manner generally referred to as balanced detection.

Balanced detection is a technique used in coherent (heterodyne or homodyne) detection. In particular, the technique is applied such that as the signal intensity at one detector increases the signal intensity at the other detector decreases. Detection of the difference between the two detector currents thus increases the net signal by a factor of two and reduces noise on the reference beam which is common to both channels through a method called common mode rejection. The resulting signal is then processed using standard electronic techniques.

The system 84 may be equally well used for the detection of magnetic fields. This is done by replacing the stress sensor 90 and magnetic shield 91 by a magnetic field sensor 90' (and flux concentrators if desired) which may be of the type described above in conjunction with FIG. 7 above.

Figure 9:
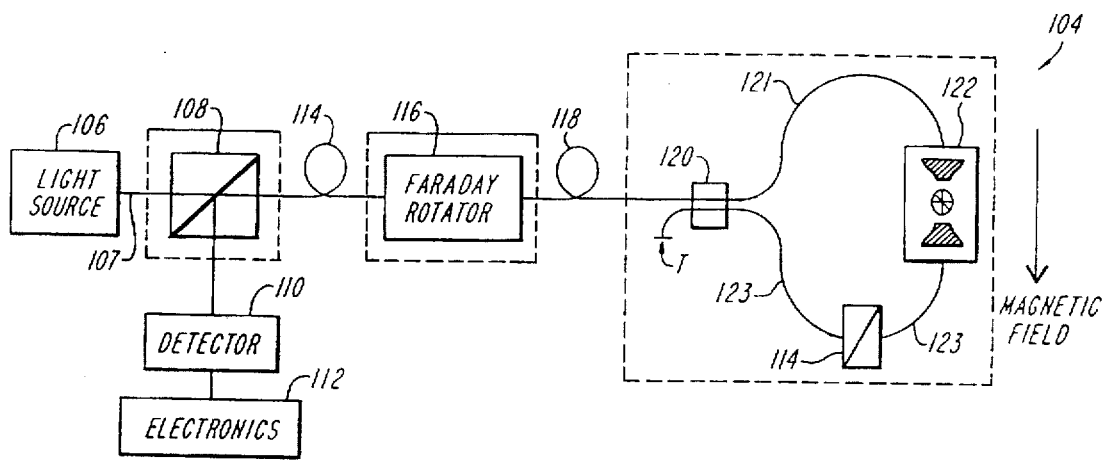
FIG. 9 is a magneto-optic magnetic field sensing system.

Referring now to FIG. 9, a magneto-optic stress sensing system 104 includes an optical path provided by fiber optic cables 107, 114, 118 and 121 each of which may be provided as single mode polarization maintaining fiber optic cables or multimode fiber optic cables depending upon the particular application.

Light from a light source 106 transmitted through a polarization splitter 108, which passes light having a first polarization to the fiber optic cable 114 and to detector 110 and terminates light having a second different polarization. Such termination may be provided by absorbing the light or redirecting the light. The polarization splitter may alternatively be replaced by an optical coupler having polarization maintaining fiber.

The polarized light propagates along the optical fiber 114 to a Faraday rotator 116, which is necessary if coherent homodyne detection is being performed. However, the Faraday rotator 116 may be omitted in so-called crossed polarizer detection scheme. The Faraday rotator 116 provides a small amount of polarization conversion which may provide leakage light in the coherent homodyne detection scheme. In those systems in which homodyne detection is not used, the Faraday rotator may be replaced by an electrooptic modulator (not shown).

The light is coupled from the Faraday rotator 116 along a fiber optic cable 118 to an optical coupler 120 which may be provided having polarization maintaining fiber. The light is coupled from the coupler 120 to a sensor 122 through a fiber optic cable 121.

The sensor 122 here includes a sensing element 123 which may be provided for example as a magnetic field sensing element disposed on a coupler block half as described above in conjunction with FIG. 4. (or channeled guided wave block) at the location where a magnetic field is to be measured. The orientation of the sensing element plane, light plane of incidence, uniaxial anisotropy field, and external magnetic field may be selected as described above in conjunction with FIG. 7.

A polarizer 124 is disposed in a fiber optic cable 123 which is coupled between a second end of the sensor 122 and a third port of the fiber optic coupler 120. A fourth port of the coupler 120 is terminated in a load T to thus terminate, by absorption, signals fed thereto. Polarizer 124 is provided to preclude the transmission of the primary polarization through the sensor 122 in, here, the counter clockwise direction to thus prevent signals from cancelling at the coupler 120 due to the non-reciprocal response of the sensing element 122. In some applications it may be desirable to replace the polarizer 124 by providing the fiber optic cable 123 as a single polarization fiber optic cable.

Figure 10:
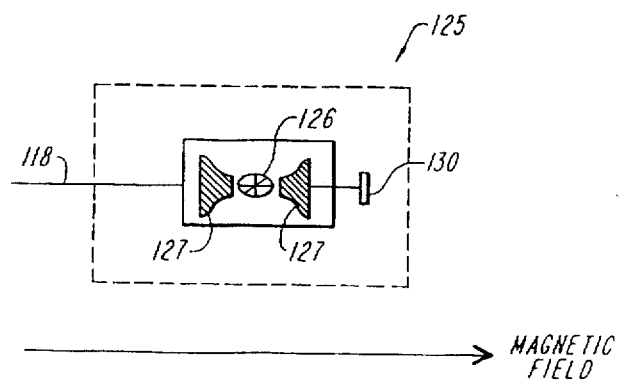
FIG. 10 is a magnetic field sensor.

Referring now to FIG. 10, a sensor 125 includes a sensing element 126 having an optional flux concentrator 127 disposed thereabout. Light which is specularly reflected from the sensing element is incident upon a high reflectivity planar mirror 130, which causes the light to reverse path. The coupler 120, the sensor 122 and polarizer 124 may be replaced by the sensor 125. In this case the orientation of the sensing element 126 relative the external magnetic field is the same as described above in conjunction with FIG. 9. The high reflectivity mirror 130 may be replaced by a high reflectivity mirror/Faraday rotator. This component reverses the polarization state and phase of the reflected light with respect to the light incident on the mirror/Faraday rotator, and has the effect of greatly diminishing the polarization noise caused by birefingence in the fiber optic cable in embodiments, using such cable.

The sensors 122, 125 described above in conjunction with FIGS. 9 and 10 may be used as stress (strain, torque, pressure) measurement systems by omitting the flux concentrators, replacing the magnetic field sensing element by a stress sensing element, and including a magnetic shield if desired. For example, one embodiment which may be used for the stress sensing element can be that described above in conjunction with FIG. 8.

Figure 11:
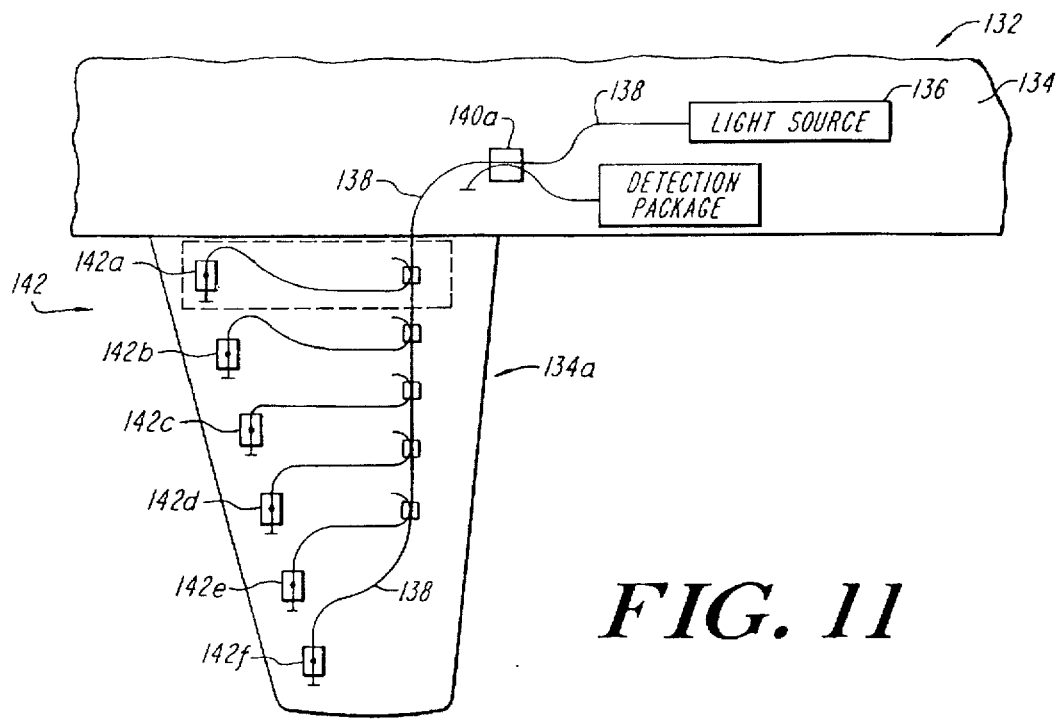
FIG. 11 is a magneto-optic stress sensing system having an array of sensors disposed on a vehicle.

Referring now to FIG. 11, a strain sensing system 132 disposed on a portion of a vehicle 134 includes a light source 136 feeding a beam of light through a fiber-optic cable 138 to a plurality of couplers 140a–140f generally denoted 140. Each of the couplers 140 couple a portion of the light provided from the light source 136 to a corresponding one of a plurality of sensor elements 142a–142f generally denoted 142.

The vehicle 134 may be provided as an aircraft and the portion of the aircraft on which the sensing system is disposed may correspond to an aircraft wing 134a for example. Thus the sensing system 132 here may provide a measure of a loading force on the aircraft wing 134a.

This arrangement provides a strain sensing system having the advantage of fiber-optics including low loss light guiding properties such that the source 136 may be separated a relatively large distance from the sensors 142. Furthermore this approach may provide a low cost approach to providing fiber-optic sensor systems. This may be especially true if the fiber-optic sensing devices 142 operate at a wavelength compatible with a fiber-optic communications networks for example and thus relatively inexpensive commercially available components may be used.

Figure 12:
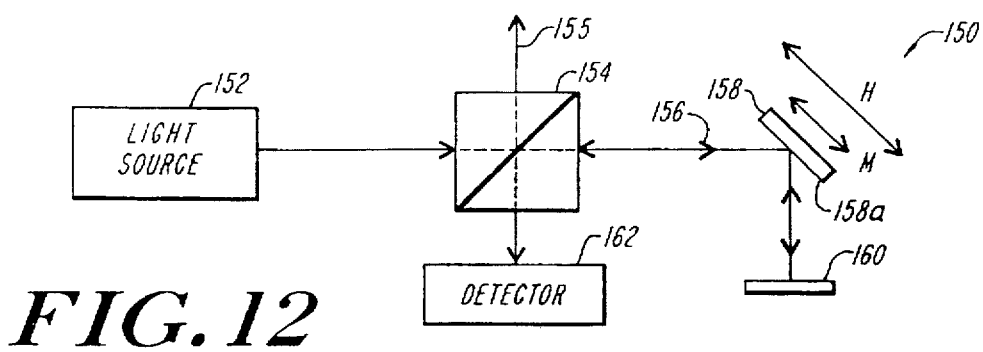
FIG. 12 is a schematic diagram of a magneto-optic magnetic field threshold sensor.

Referring now to FIG. 12 a magneto-optic Kerr effect (MOKE) magnetic field threshold sensor (MFTS) 150 includes a light source 152 which projects light toward a polarizing beamsplitter 154. The light source may be provided, for example, as a laser light source or as a light emitting diode (LED) while the beamsplitter 154 could be provided as a polarization splitting fiber optic coupler.

As described herein s and p polarizations are defined relative to the light plane of incidence of the sensing element 150 rather than relative to other optical components along the path the light follows. The polarizing beamsplitter 154 reflects substantially all light (e.g. 99% of the light) having a first light polarization (e.g. s-polarized light) in a direction indicated by vector 155 and allows substantially all light having a second polarization (e.g. p-polarized light) to be transmitted in a direction indicated by vector 156 toward a sensing film 158.

As used herein the terms "substantially all the light" or "predominately" generally refer to the amount of light greater than 90% which is intentionally reflected or transmitted by an optical component. The precise amount of light reflected or transmitted by any particular component depends upon a variety of factors including but not limited to the specifications of the optical components used and the amount of electric field mixing desired for coherent detection. In practical embodiments, it would be preferable to use optical components having appropriate reflectance and transmittance properties typically of about 99 percent or greater. It should be noted however that optical components having relatively high optical performance characteristics are relatively expensive.

It should thus also be noted that optical components used in relatively inexpensive systems may have optical characteristics which are not optimum (i.e. having desired transmission and reflection characteristics less then 99 percent) and that, with the exception of polarization scattering, the effect on system performance due to the use of optical components having less than optimum optical characteristics can be minimized via signal processing techniques. Polarization conversion such as that by Brillouin scattering, which inherently occurs in the optical components however, directly affects the system signal to noise ratio. Birefringence-induced noise can be reduced by using highly twisted low birefringence fiber optic cables.

The sensing film may be provided as the types described in conjunction with FIGS. 1–2 above. As will be described in conjunction with FIG. 13 below, the sensing film is disposed such that light having the second polarization reflects off a first surface 158a of the sensing film 158 and undergoes a small conversion of polarization.

Figure 13:
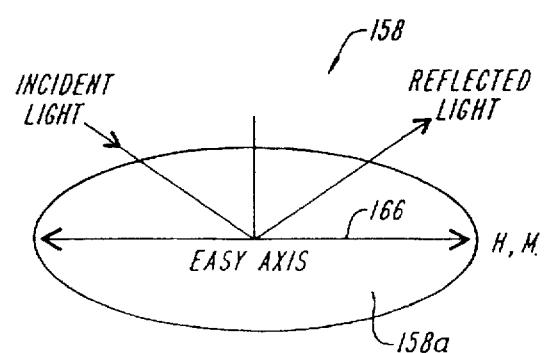
FIG. 13 is a diagrammatical of a sensing film.

Referring briefly to FIG. 13, the sensing film 158 is shown having light incident and reflected from surface 158a. For proper operation of the MOKE MFTS system 150 (FIG. 12) an easy axis 166 of the sensing film 158 is aligned to lie in the plane of incidence of the light, and also aligned in a direction which is collinear with the direction of a magnetic field H. The sensing film magnetization M will then lie in a direction which is either parallel or antiparallel to the direction of the magnetic field H, depending upon the sensor history.

As mentioned above, the sensing film 158 may be provided as the types described in conjunction with FIGS. 1–2 and is disposed such that light having the second polarization reflects off a first surface 158a of the sensing film 158 and undergoes a small conversion of polarization. For example, a polarization conversion from p-polarized light to s-polarized light, and vice versa, can take place with a different sign dependent upon the orientation of a magnetization vector M of the sensing film 158.

For example, assume as shown in FIG. 13 linearly polarized light of one polarization duplicative (e.g. s-polarization) is incident on the film surface 158a. After reflection, the polarization of the reflected light will be rotated, for example, in a counterclockwise direction. The reflected light will also be reduced in amplitude due to absorption. Thus, if the electric field of the incident light is expressed as:

$$\vec{E}_i = E_s \hat{s}$$

where $E_i$ corresponds to the complex value of the incident electric field;

$E_s$ corresponds to the amplitude of the s-directed component of the electric field; and $\hat{s}$ is a unit vector indicating the direction of polarization. The reflected light may then be expressed as:

$$\vec{E}_r = P_{ss} E_s \hat{s} + P_{sp} E_s \hat{p}$$

in which:

$E_r$ corresponds to the value of the complex value of the reflected electric field;

$P_{ss}$ and $P_{sp}$ are the Jone's matrix elements describing the reflection process; and $\hat{s}$ and $\hat{p}$ are unit vectors marking the linear polarizations of the light components. Thus, the second term on the right hand side of the equation used to compute reflected light $E_r$ corresponds to the amount of polarization conversion. That is, the amount of light converted from s to p polarization.

Now if the direction of the magnetic field H switches (i.e. reverses directions) and has sufficient strength (i.e. H>Hc) to also switch the direction of the magnetization vector M, the change in light reflectance will be as follows: 1) the direction of rotation will reverse (here to clockwise); and 2) the electric field component $E'_r$ of the reflected light may be expressed as:

$$\vec{E}'_r = P_{ss} E_s \hat{s} - P_{sp} E_s \hat{p}$$

Figure 14:
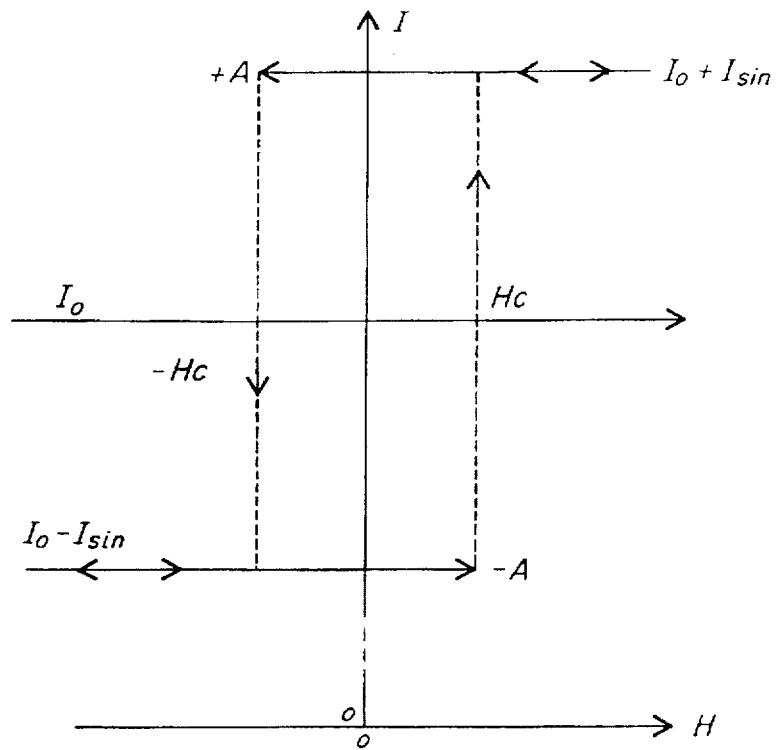
FIG. 14 is a plot of an output signal generated by the sensor of FIG. 12.

Because the sign of the polarization conversion term (i.e. the second term in the above equation) is retained in this mixing technique, the detector signal before signal processing appears as shown in the plot in FIG. 14 where the vertical axis is current (I).

Since magnetic materials have bistable "states," the history of the materials becomes important. As shown in FIG. 14, in the range between −Hc<H<+Hc the magnetization vector M assumes one of two possible states. Assuming M is positive (here take the y-axis in FIG. 14 as M), the amplitude of the magnetic field H can range everywhere from just above a value of −Hc to a value up to positive infinity and the direction of the magnetization vector M will not change. However, when the amplitude of the magnetic field H has a value less than −Hc, the direction of the magnetization vector M changes. Thus, since the starting state of the magnetic material is unknown, the history of the magnetic material impacts the initial instance of the changing magnetization vector and also in missing steps (i.e. changes in magnitude between +A and −A as shown in FIG. 13) if the threshold (i.e. the selected value of the coercive magnetic field Hc) is set too high.

Thus, the orientation of the magnetization vector M will reverse from the anti-parallel to the parallel orientation if the value of the magnetic field H exceeds a critical value determined by a coercive magnetic field (Hc) of the sensing film 158. Thus the direction of the magnetization vector M can be used to track a switching magnetic field H as long as the magnitude of the magnetic field H exceeds the threshold established by the value of coercive magnetic field $H_c$.

The switching performance, (i.e. the ability of system 150 to track switching magnetic fields) is independent of the rate at which the magnetic field H switches. Thus when the amplitude of the magnetic field H switches, to switch rates above 10 megacycles per second (10 MHz) and exceeds values of +/−Hc, the direction of the magnetization vector M switches. This allows the system to detect the rotation of shafts that are turning at a relatively slow rate and is important in those applications which require precise knowledge of the position of a rotatable shaft or wheel.

Magnetic noise can be mitigated by using sensor films having increasingly large values of the coercive magnetic field $H_c$. The value of a coercive magnetic field $H_c$ is typically in the range of 0.1 Oe to 50 Oe and can be established in the film either during film deposition or by using post-processing techniques well known to those of ordinary skill in the art. It should, however, be noted that the sensor may also be provided from a permalloy film having coercive magnetic field values in the range of about to 0.01 Oe to greater than 100 Oe.

It should also be noted that in the sensor system described above in conjunction with FIG. 7, the external magnetic field to be measured is oriented predominately along the hard axis of the sensor film. In the present MFTS embodiment, however, the easy axis of the sensor film 158 is aligned collinearly with the external magnetic field to be measured.

Referring again to FIG. 12, the light is reflected from the first surface 158a of the sensor 158 toward a mirror 160. The light reflects off the mirror and travels back toward the sensing film 158. The light again reflects off the surface 158a of the sensing film 158 and travels from the sensing film toward the polarizing beamsplitter 154. In some embodiments the mirror 160 can be replaced by a mirror/Faraday rotator, which is also a nonreciprocal element and has the effect of reducing the birefringence-induced noise from the fiber optic cable.

The polarizing beamsplitter 154 reflects the light having the first polarization (e.g. s-polarized light) and transmits the light having the second polarization (e.g. p-polarized light). The light reflected from the polarizing beamsplitter 154 travels to a detector 162.

The light transmitted to detector 162 includes a first signal component and a second signal component. The first signal component corresponds to light which has undergone polarization rotation at the magnetic sensing film 158 (i.e. the light which undergoes polarization conversion) and the second signal component corresponds to a "leakage signal" due to imperfect optical components. Thus, since only a small portion of the light is polarization converted, the first signal component is provided having a relatively small amplitude compared with the amplitude of the second signal component.

For example, the "leakage" light may correspond to one percent of the light which passes through the beamsplitter, while less than 0.1 percent of light is polarization converted. It should be noted that the first signal (i.e. the polarization converted signal) contains information while the "leakage" light contains no information.

If the light provided by the light source 152 is sufficiently coherent, such that the two signal components mix at the detector 162 which results in an information-containing signal having an amplitude which is constant with respect to the value of the external magnetic field H and which includes an information-independent current.

This detection technique is similar to that used in the sensor systems described above in conjunction with FIGS. 7 and 9 and provides a detector signal having characteristics similar to those shown in FIG. 14.

It should be noted that the light may be propagated between the optical components of the MOKE MFTS 150 using any desirable media. For example, a fiber optic cable can be coupled between the light source 152 and polarizing beamsplitter 154. Likewise, a fiber optic cable can be coupled between the polarizing beamsplitter 154 and the sensing film 158 and between the sensing film 158 and the mirror 160. A fiber optic cable can also be used to couple the polarizing beamsplitter 154 to the detector 162. Thus, light could propagate between the components in free space or, preferably, the optical components could be coupled via bulk optical components (e.g. lenses) or fiber optic cables.

Referring now to FIG. 14, the detector current is shown to adopt one of two values depending upon the strength of the magnetic field H. As shown in FIG. 14 the Y-axis corresponds to current, while the X-axis corresponds to magnetic field strength.

In some embodiments it may be desirable to have electronics associated with the detector 162 to remove the DC signal component of the detected signal via filtering or any other well known techniques prior to amplifying the detector signal.

In other embodiments, as will be described below in conjunction with FIG. 15, it may be desirable to examine the derivative of the detected signal. With this technique, a voltage spike would be generated. The voltage spikes would then be counted in order to determine and track the position of the magnetic field.

Figure 15:
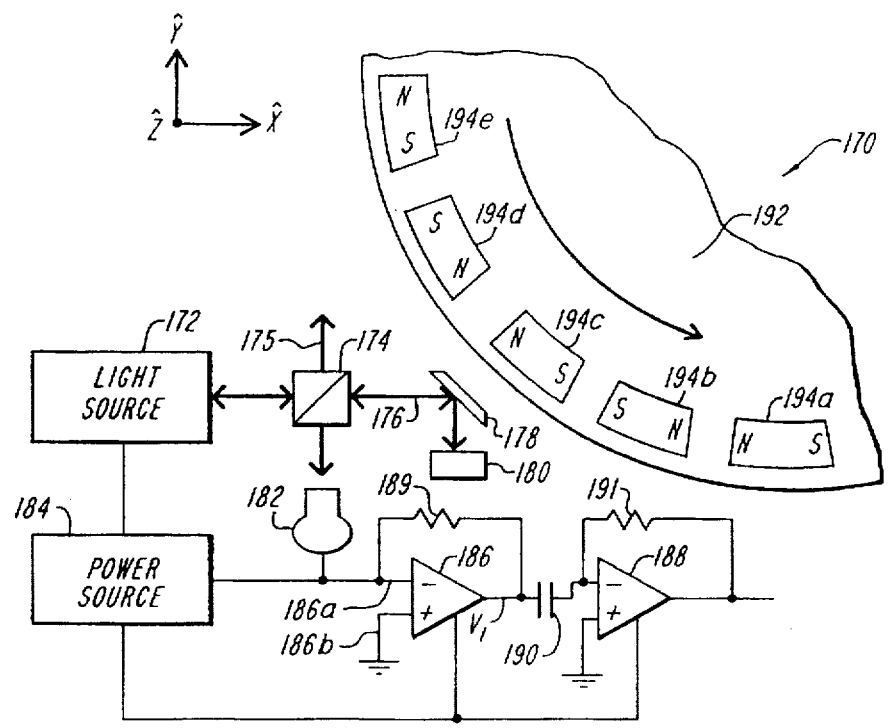
FIG. 15 is a schematic diagram of a system for the measurement of a rotating member.

Referring now to FIG. 15, a rotation sensor 170 includes a light source 172 which provides a light signal to a polarizing beamsplitter 174. The light source 172 and polarizing beamsplitter 174 may be similar to the light source and beamsplitter discussed above in conjunction with FIG. 12. The polarizing beamsplitter 174 reflects light having a first light polarization (e.g. s-polarized light) in a direction indicated by vector 175 and allows light having a second polarization (e.g. p-polarized light) to be transmitted in a direction indicated by vector 176 toward a sensing film 178.

The sensing film 178 may be provided as the types described in conjunction with FIGS. 1–2 above and is disposed such that light having the second polarization reflects off a first surface 178a of the sensing film 178 and undergoes a small polarization conversion. For example, a polarization conversion from p-polarized light to s-polarized light, and vice versa, may take place.

The light is reflected from the first surface 178a of the sensor 178 toward a mirror 180. The light reflects off the mirror 180 and travels back toward the sensing film 178. The light again reflects off the surface 178a of the sensing film 178, and again undergoes polarization conversion before travelling from the sensing film 178 toward the polarizing beamsplitter 174.

The polarizing beamsplitter 174 reflects the light having the first polarization (e.g. s-polarized light) and transmits the light having the second polarization (e.g. p-polarized light). The light reflected from the polarizing beamsplitter 174 travels to a detector 182.

In a manner similar to that described above in conjunction with FIG. 12, the light transmitted to detector 182 includes a first signal component having a relatively small amplitude and a second signal component having an amplitude which is larger than the amplitude of the first signal component. If the light provided by the light source 172 is substantially coherent, the two signal components mix at the detector 182 which results in a signal having an amplitude which is substantially constant with respect to the value of an external magnetic field H and which includes a DC signal component.

A power source 184 is coupled to the light source 172. If the light source 172 is provided as a laser diode, for example, then the power source 184 provides a substantially constant current to the light source 172. The power source 184 also provides power to a pair of differential amplifiers 186, 188 at bias terminals 186e, 188e. The power source 184 also provides a suppression current to a first input 186a of the first amplifier 186. A second input 186b of the first amplifier 186 is coupled to a first reference potential which here corresponds to ground. A first feedback resistor 187 having a resistance value of $R_1$ has a first terminal coupled to the inverting input terminal 186a of the amplifier 186 and a second terminal coupled to the output terminal 186c of the amplifier 186.

The second amplifier 188 has an inverting input terminal 188a AC coupled to an output terminal 186c of the first amplifier 186 through a capacitor 190. A second feedback resistor 191 having a resistance value of $R_2$ has a first terminal coupled to the inverting input terminal 188a of the amplifier 188 and a second terminal coupled to the output terminal 188c of the amplifier 188.

The sensing film 178 is disposed proximate a rotating member 192, a portion of which is here shown. The rotating member 192 may correspond to a shaft or a wheel for example and is here shown rotating in a counter-clockwise direction. The member 192 has coupled thereto a plurality of magnets 194a–194e generally denoted 194. Each of the magnets 194 have a magnetic field which interacts with the sensing film 178.

The sensing film 178 is disposed such that when each one of the plurality of magnets 194 is aligned directly across from the sensing film 178 an easy axis of the sensing film 178 is aligned in a direction which is collinear with the direction of the magnetic field of the magnet 194.

In operation, a portion of the light having a predetermined polarization is passed through the beamsplitter 174 and reflects off the sensor film 178 which may, for example, be provided as an iron-Boron film. The light is then incident on and reflected from the mirror 180.

The mirror 180 is positioned to reflect light back toward the sensor 178. Thus, light from the light source 172 is returned by the mirror 180, reflecting once from the sensor film 178 on transmission and once more on return.

With the easy axis of the sensor film 178 in the X-Y plane of the paper and colinear to the direction of the magnetic fields provided by the magnets 194 at the sensor film 178 being perpendicular to the radius of the rotating member 194, the magnetic fields created by the magnets 194 switch the magnetization M of the sensing film 178 between saturation positions.

In response to the film magnetization varying from saturation in one direction to saturation in the opposite direction, a current from the detector 182 switches from one current level to another, resulting in a change of $\pm 2I_{sig}$ as shown in FIG. 14. The two amplifier stages 186 and 189, with associated components, produce a voltage spike for each change in the current. Specifically, the first amplifier provides a transimpedance gain at a level selected to avoid saturation at its output. The capacitor 190 provides capacitive coupling, removing the low-frequency components and leaving a voltage spike. While the duration of the current transition is determined by the characteristics of the sensing film element, the duration of the voltage spike is determined by the time constant of the circuit. This time constant must be selected to be greater than the time for the current transition, but less than the time between successive transitions.

The electrical circuit shown in FIG. 15 must be designed so that the output voltage spikes are detectable in noise caused by the detector, background, and circuit components.

Figure 16:
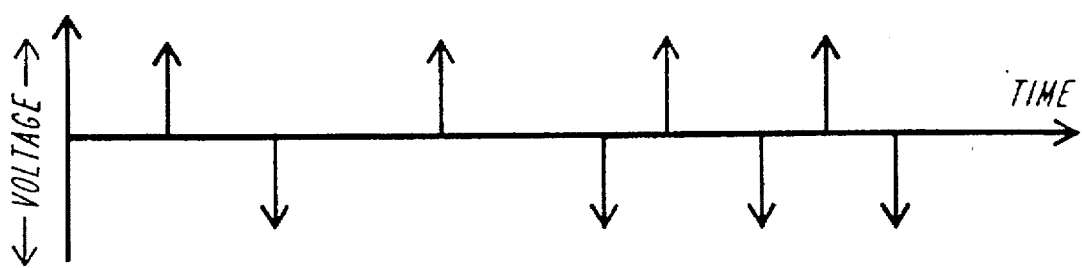
FIG. 16 is a plot of an output signal generated by the system of FIG. 15.

The output from the system shown in FIG. 15 will be a train of alternating positive and negative voltage pulses, as shown in FIG. 16. The spacing between pulses will vary with the rotational velocity of the rotating member 192, which is being measured. The pulse output train can then be used with pulse counting circuitry to provide a measurement of the rotational velocity, for example when this system is used as a tachometer.

The sensing film element characteristic that affects the magnetization switching time is the magnitude of the in-plane uniaxial anisotropy field ($H_k$). The sensing film should be produced such that in-plane uniaxial anisotropy field lies in the range of 0.1 Oe to 10 Oe, while retaining the desired value of $H_c$. Methods for producing films having this combination of properties are well known to practitioners of the art. Switching speeds of at least 1 Megacycle per second (1 MHz) are obtained by this technique. Faster switching speeds may be obtained by applying a transverse magnetic field ($H_t$) along the sensing film hard axis through the use of permanent magnets or Helmholtz coils. The magnitude of $H_t$ must be smaller than $H_k$, and is chosen in accordance to the desired switching time, given the other parameters of the sensing film.

Figure 17:
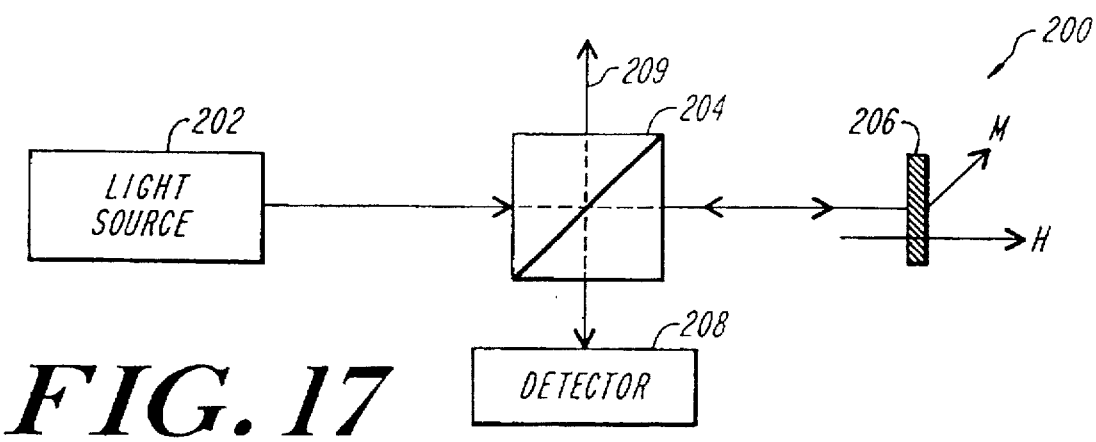
FIG. 17 is a schematic diagram of a high field magneto-optic Kerr effect magnetic field sensor.

Referring now to FIG. 17 a high field magneto-optic Kerr effect magnetic field (HFMF) sensing system 200 includes a light source 202, a polarization beamsplitter 204, a sensing element 206 and a detector 208, each of which may be similar to like components described above in conjunction with FIGS. 3–10, 12, 13 and 15.

The light source 202 can be provided for example as a laser or a light emitting diode (LED). Light propagation between the components 202–208 can be either in free space or, preferably, in either bulk optical components or fiber optic cables. Light from the source 202 is transmitted toward the polarizing beamsplitter 204. The polarizing beamsplitter 204 reflects substantially all (e.g. 99%) of one light polarization (e.g. s-polarized light) in a direction indicated by vector 209 and allows substantially all of the second polarization (e.g. p-polarized light) to travel toward the sensing film 206. The sensing film 206 is disposed such that the direction of the magnetic field to be measured H is normal to the plane in which the sensing film 206 is disposed.

Figure 18:
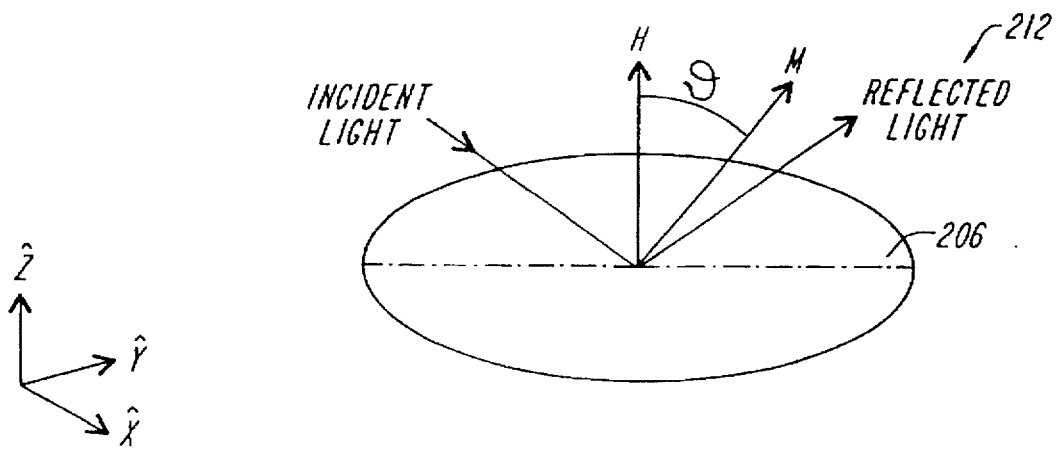
FIG. 18 is a diagrammatical view of a sensing film.

Referring briefly to FIG. 18, it can be more clearly seen that the sensing film 206 is arranged in an X-Y plane and the magnetic field to be measured H is in the Z direction and thus is normal to the plane in which the sensing film 206 is disposed. This causes the film magnetization vector M to rotate towards the direction of the magnetic field H by an angle (θ) which may be computed as:

$$\cos\theta = H/4\pi M_{\mathit{eff}}$$

in which $M_{\mathit{eff}}$ is the effective magnetization of the magnetic film and may be computed using conventional techniques well known to those of ordinary skill in the art.

Light reflected from the sensing film 206 undergoes a small conversion of polarization, e.g from p-polarized light to s-polarized light, and vice versa, which is proportional to cosθ.

It should be noted that in FIG. 17 the incident and reflected light is shown in a direction along an axis which is normal to the plane of the sensing film 206, however, in FIG. 18 the light is shown to be incident and reflected from the sensing film 206 at an oblique angle.

Referring again to FIG. 17, The light is reflected from the sensing film 206 back toward the polarizing beamsplitter 204. The polarizing beamsplitter 204 again reflects and transmits the different light polarizations.

The light reflected from the polarizing beamsplitter 204 travels to the detector 208. The light fed to the detector 208 includes a small signal component which arises from the polarization rotation at the magnetic sensing film 206, and a larger component which "leaks" through the imperfect optical components. As described above in conjunction with FIG. 12, if the light is reasonably coherent, these two signal components will mix at the detector 208, and yield an information-containing current that is linear in H, a negligible information-containing current that is quadratic in H, and a large (DC) non-information-containing current (from the "leakage" light).

As described above in conjunction with FIG. 15, electronics can be used to filter the DC signal component, and amplify the desired signal.

It should be noted that since this system operates with the light beam normally incident to the sensing film it is relatively simple to construct and thus should be relatively inexpensive to manufacture.

For example, the sensing film 206 can be deposited directly onto the end of a fiber optic cable coupled to the beamsplitter 204 using well known optical film deposition techniques. Alternatively, the sensor film 206 could be disposed on a fiber optic cable using lift-off techniques. In some embodiments it may be desirable to multiplex a plurality of such sensing films with a single electronics package. In yet another embodiment, the film could be deposited onto a substrate, with the fiber optic cable then being mounted onto the film using appropriate adhesives and index matching materials. Here the film plane will be at right angles to the fiber optic cable axis.

It should be noted that in the sensing system 200 the external magnetic fields must compete with the film demagnetizing field which has a value typically in the range of 2,000 to 23,000 Oe depending primarily upon the film composition and secondarily on the film dimensions. Thus, the magnetic fields should be provided having a relatively large magnitude in order to overcome the strength of the film demagnetizing field and rotate the film magnetization vector.

The system 200 provides a detector output response which is substantially linear with respect to the applied magnetic field and system sensitivity should be on the order of 1 part per million. Such sensitivity computations may be made for example using techniques analogous to those described in the article entitled Magnetic Field Measurements Using Magneto-optic Kerr Effect Sensors published in the Journal of Optical Communications, Nov. 1995.

Increased sensitivity is achieved in this system due to the fact that the polar Kerr effect reflection coefficient is larger than that due to the longitudinal Kerr effect. Thus, the sensor 200 can be used in those applications which require sensitive measurements of relatively high magnetic fields.

Having described preferred embodiments of the invention, it will now become apparent to one of ordinary skill in the art that other embodiments incorporating the concepts may be used. It is felt, therefore, that these embodiments should not be limited to disclosed embodiments but rather should be limited only by the spirit and scope of the appended claims.

What is claimed is:

1. A magneto-optic Kerr effect magnetic field sensor comprising:

a light source;

a magneto-optic Kerr effect magnetic field sensing element, said sensing element comprising a plurality of thin-film layers disposed on a substrate, at least one of said layers being of a reflective magnetic material and having: an in-plane magnetization orientation; a well-defined in-plane uniaxial anisotropy; and known magneto-optic Kerr effect and in-plane uniaxial anisotropy field values, wherein said sensing element is disposed such that an in-plane hard axis of said at least one layer of reflective magnetic material lies in a light plane of incidence and collinear to an external magnetic field to be measured, wherein said at least one reflective magnetic material layer has at least one domain having a rotatable magnetization vector that rotates in response to said external magnetic field, and said at least one layer of reflective magnetic material is disposed such that a polarization characteristic of incident light is altered upon reflectance from said sensing element;

a first polarizing element disposed between said light source and said magneto-optic Kerr effect magnetic field sensing element wherein said light source directs a light beam to said first polarizing element and said first polarizing element transmits a first polarized light beam having a first predetermined polarization characteristic to said magneto-optic Kerr effect magnetic field sensing element;

a second polarizing element disposed to intercept light reflected from said magneto-optic Kerr effect magnetic field sensing element and to transmit a second polarized light beam having a second predetermined polarization characteristic; and a detector disposed to intercept said second polarized light beam from said second polarizing element.

2. The sensor of claim 1 wherein the light source is selected from the group consisting of:

a laser light source; and a light emitting diode (LED).

3. The sensor of claim 1 wherein:

said first polarizing element provides maximum transmission of a first polarization vector of said light source light beam and a relatively small, predetermined transmission of a second, orthogonal, polarization vector of said light source light beam, said second polarization vector being an information-independent second polarization vector component; and said second polarizing element provides maximum transmission of said second polarization vector of said light and minimal transmission of said first polarization vector of said light reflected from said sensing element.

4. The sensor of claim 3 wherein said first polarization vector is s-polarized light, and said second polarization vector is p-polarized light, the light polarizations being defined with respect to said sensing element.

5. The sensor of claim 3 wherein said first polarization vector is p-polarized light, and said second polarization vector is s-polarized light, the light polarizations being defined with respect to said sensing element.

6. The sensor of claim 1 wherein an in-plane magnetization vector component measured along said hard axis of said at least one layer of magnetic material is proportional to a ratio of said external magnetic field to said magnetic material in-plane uniaxial anisotropy field value.

7. The sensor of claim 1 wherein an in-plane magnetization vector component of said at least one layer of magnetic material measured along said light plane of incidence is proportional to a ratio of said external magnetic field to said magnetic material in-plane uniaxial anisotropy field value.

8. The sensor of claim 3 wherein said at least one sensing element layer of magnetic material is disposed to intercept said first polarized light beam from said first polarizing element, and to reflect light having said altered polarization characteristic by converting a portion of said first polarization vector to said second polarization vector by an amount determined by an in-plane magnetization vector component of said at least one layer of magnetic material measured along said light plane of incidence, a magnitude of said first polarization vector and said magneto-optic Kerr effect value, as provided by the so-called longitudinal magneto-optic Kerr effect, said altered light being an information-containing component of said second polarization vector of said second polarized light beam.

9. The sensor of claim 8 wherein said information-containing component of said second polarization vector of said second polarized beam has an amplitude that is smaller than an amplitude of said information-independent second polarization vector component of said second polarized light beam.

10. The sensor of claim 1 wherein said detector is selected from the group consisting of:
   a semiconductor photodiode; and
   a photomultiplier tube.

11. The sensor of claim 3 wherein said detector is disposed to intercept said second polarized light beam transmitted through said second polarizing element, to detect said information-containing and information-independent components of said second polarization vector as electrical currents, to mix said electrical currents, and to provide as an output of said detector a summation current.

12. The sensor of claim 11 wherein said detector output is comprised of the sum of:
   an information-containing electrical current, which is linearly proportional to the ratio of said external magnetic field value to said in-plane uniaxial anisotropy field value of said at least one layer of magnetic material; and
   an information-independent electrical current, which is larger in magnitude than said information-containing electrical current but which remains constant with respect to the value of said external magnetic field.

13. The sensor of claim 11 wherein said magneto-optic Kerr effect sensing element is disposed on a glass block.

14. The sensor of claim 1 wherein said magneto-optic Kerr effect sensing element is disposed on a fiber optic coupler half block.

15. The sensor of claim 1 further comprising polarization-maintaining fiber optic cable coupled between each optical element of said magnetic field sensor for transmitting light between said optical elements.

16. The sensor of claim 15 wherein said first and second polarizing elements are provided as polarizing fiber optic cable.

17. The sensor of claim 11 wherein said reflective layer of magnetic material is provided as a thin metallic ferromagnetic film.

18. The sensor of claim 17 wherein said thin metallic ferromagnetic film is provided as an amorphous ferromagnetic alloy.

19. The sensor of claim 17 wherein said thin metallic ferromagnetic film is provided as an array of ellipsoidal thin film elements disposed upon said substrate.

20. The sensor of claim 1 further comprising a flux concentrator element disposed about said magneto-optic Kerr effect magnetic field sensing element.

21. The sensor of claim 20 wherein said flux concentrator element is provided as a ferromagnetic thin film.

22. The sensor of claim 20 wherein said flux concentrator ms disposed on said substrate adjacent said sensing element.

23. A magneto-optic Kerr effect magnetic field sensing system comprising:
   a light source;
   a polarizing beamsplitter disposed to receive a light beam from said light source and to transmit a light beam having a predetermined polarization characteristic;
   a magneto-optic Kerr effect magnetic field sensing element, said sensing element disposed to receive said light beam having said predetermined polarization characteristic from said polarizing beamsplitter, said sensing element comprising a plurality of thin film layers disposed on a substrate, at least one layer of which being a layer of reflective magnetic material and having: an in-plane magnetization orientation; a well-defined in-plane uniaxial anisotropy; and known magneto-optic Kerr effect and in-plane uniaxial anisotropy field values, wherein said sensing element is disposed such that an in-plane hard axis of said at least one layer of reflective magnetic material lies in a light plane of incidence and collinear to an external magnetic field to be measured, wherein said at least one reflective magnetic material layer has at least one domain having a rotatable magnetization vector that rotates in response to said external magnetic field, and said at least one layer of reflective magnetic material is disposed such that said predetermined polarization characteristic of said light beam from said polarizing beamsplitter is altered upon reflectance from said sensing element;
   a highly reflective element disposed to intercept light reflected from said sensing element and reflect light back to said sensing element, wherein said reflected light is then reflected towards said beamsplitter;
   a detector disposed to intercept light that reflects from said beamsplitter after being reflected from said sensing element.

24. The sensing system of claim 23 wherein the light source is selected from the group consisting of:
   a laser light source; and
   a light emitting diode (LED).

25. The sensing system of claim 23 wherein:
   said polarizing beamsplitter provides maximum transmission of a first polarization vector of said incident light and a relatively small, predetermined transmission of a second, orthogonal polarization vector of said incident light, said small transmitted second polarization vector being an information-independent second polarization vector component; and said polarizing beamsplitter reflects the remainder of said second polarization vector of said light and provides minimum reflection of said first polarization vector of said incident light.

26. The sensing system of claim 25 wherein said first polarization vector is s-polarized light, and said second polarization vector is p-polarized light, the light polarizations being defined with respect to said sensing element.

27. The sensing system of claim 25 wherein said first polarization vector is p-polarized light, and said second polarization vector is s-polarized light, the light polarizations being defined with respect to said sensing element.

28. The sensing system of claim 23 wherein an in-plane magnetization vector component measured along said hard axis of said at least one layer of magnetic material is proportional to a ratio of said external magnetic field to said magnetic material in-plane uniaxial anisotropy field value.

29. The sensing system of claim 23 wherein an in-plane magnetization vector component of said at least one layer of magnetic material measured along said light plane of incidence is proportional to a ratio of said external magnetic field to said magnetic material in-plane uniaxial anisotropy field value.

30. The sensing system of claim 25 wherein said at least one sensing element layer of magnetic material is disposed to intercept said light beam having said predetermined polarization characteristic-provided by transmission through said polarizing beamsplitter, and to reflect light having said altered polarization by converting a portion of said first polarization vector to said second polarization vector by an amount determined by said in-plane magnetization vector component of said at least one layer of magnetic material measured along said light plane of incidence, a magnitude of said first polarization vector and said magneto-optic Kerr effect value, as provided by the so-called longitudinal magneto-optic Kerr effect, said altered light being an information-containing component of said second polarization vector.

31. The sensing system of claim 30 wherein said information-containing component of said second polarization vector has an amplitude smaller than an amplitude of said information-independent second polarization vector component.

32. The sensing system of claim 23 wherein said detector is selected from the group consisting of:
a semiconductor photodiode; and
a photomultiplier tube.

33. The sensing system of claim 30 wherein said polarizing beamsplitter is disposed to intercept light reflected off said sensing element from said reflective element, said intercepted light comprising a first polarization vector component, said information-containing second polarization vector component, and said information-independent second polarization vector component, said polarizing beamsplitter reflecting substantially all of said second polarization vector components toward said detector and transmitting substantially all of said first polarization vector component.

34. The sensing system of claim 33 wherein said detector is disposed to intercept and detect said second polarization vector components reflected from said polarizing beamsplitter as electrical currents, to mix said electrical currents, and to provide a summation current as an output of said detector.

35. The sensing system of claim 34 wherein said detector output is comprised of the sum of:

an information-containing electrical current, which is linearly proportional to the ratio of said external magnetic field value to said in-plane uniaxial anisotropy field value of said at least one layer of magnetic material; and an information-independent electrical current, which is larger in magnitude than said information-containing electrical current but which remains constant with respect to the value of said external magnetic field.

36. The sensing system of claim 23 wherein said magneto-optic Kerr effect sensing element is disposed on a glass block.

37. The sensing system of claim 23 wherein said magneto-optic Kerr effect sensing element is disposed on a fiber optic coupler half block.

38. The sensing system of claim 23 wherein said highly reflective element is selected from the group consisting of:
a first highly reflective mirror; and
a nonreciprocal optical element disposed to intercept light reflected from said sensing element and to transmit light having altered polarization characteristics towards a second highly reflective mirror, wherein said second highly reflective mirror reflects said light back towards said nonreciprocal optical element where said altered polarization characteristics are further altered before transmitting said light back towards said sensing element.

39. The sensing system of claim 38 wherein said nonreciprocal optical element and said second highly reflective mirror are disposed to provide alterations to said polarization characteristics of said light reflected back towards the sensing element to minimize polarization noise effects along a light propagation path.

40. The sensing system of claim 38 wherein said nonreciprocal optical element is provided as a Faraday rotator.

41. The sensing system of claim 39 further comprising single-mode fiber optic cable coupled between each optical element of said magnetic field sensing system.

42. The sensing system of claim 23 wherein said reflective layer of magnetic material is provided as a thin metallic ferromagnetic film.

43. The sensing system of claim 42 wherein said thin metallic ferromagnetic film is provided as an amorphous ferromagnetic alloy.

44. The sensing system of claim 42 wherein said thin metallic ferromagnetic film is provided as an array of ellipsoidal thin film elements disposed upon said substrate.

45. The sensing system of claim 23 further comprising a flux concentrator element disposed about said magneto-optic Kerr effect magnetic field sensing element.

46. The sensing system of claim 45 wherein said flux concentrator element is provided as a ferromagnetic thin film.

47. The sensing system of claim 45 wherein said flux concentrator is disposed on said substrate adjacent said sensing element.

48. A magneto-optic Kerr effect magnetic field sensor comprising:
a light source;
a magneto-optic Kerr effect magnetic field sensing element, said sensing element comprising a plurality of thin-film layers disposed on a substrate, at least one of said layers being of a reflective magnetic material and having: an in-plane magnetization orientation; a well-defined in-plane uniaxial anisotropy; and known magneto-optic Kerr effect and in-plane uniaxial anisotropy field values, wherein said sensing element is disposed such that an in-plane hard axis of said at least one layer of reflective magnetic material lies in a light plane of incidence and collinear to an external magnetic field to be measured, wherein said at least one reflective magnetic material layer has at least one domain having a rotatable magnetization vector that rotates in response to said external magnetic field, and said at least one layer of reflective magnetic material is disposed such that a polarization characteristic of incident light is altered upon reflectance from said sensing element;

a first polarizing element disposed between said light source and said magneto-optic Kerr effect magnetic field sensing element wherein said light source directs a light beam to said first polarizing element and said first polarizing element transmits a first polarized light beam having a first predetermined polarization characteristic to said magneto-optic Kerr effect magnetic field sensing element;

a second polarizing element disposed to intercept light reflected from said magneto-optic Kerr effect magnetic field sensing element, to transmit light having a second predetermined polarization characteristic, and to reflect light having a third predetermined polarization characteristic;

a first detector disposed to intercept light having said second predetermined polarization characteristic that is transmitted through said second polarizing element; and a second detector disposed to intercept light having said third predetermined polarization characteristic that is reflected from said second polarizing element.

49. The sensor of claim 48 wherein the light source is selected from the group consisting of:

a laser light source; and a light emitting diode (LED).

50. The sensor of claim 48 wherein:

said first polarizing element provides maximum transmission of a first polarization vector of said light source light beam and a relatively small, predetermined transmission of a second, orthogonal, polarization vector of said light source light beam, said second polarization vector being an information-independent second polarization vector component; and said second polarizing element intercepts light reflected from said magneto-optic Kerr effect sensing element, transmits light having said second predetermined polarization characteristic to said first detector, and reflects light having said third predetermined polarization characteristic to said second detector.

51. The sensor of claim 50 wherein said first polarization vector is s-polarized light, and said second polarization vector is p-polarized light, the light polarizations being defined with respect to said sensing element.

52. The sensor of claim 50 wherein said first polarization vector is p-polarized light, and said second polarization vector is s-polarized light, the light polarizations being defined with respect to said sensing element.

53. The sensor of claim 50 wherein:

said first polarizing element is provided as a polarizer; and said second polarizing element is provided as a polarization splitter.

54. The sensor of claim 53 wherein said polarization splitter is disposed to transmit light to said first detector having a first predetermined combination of first polarization vector and second polarization vector, and to reflect light having a second predetermined combination of first polarization vector and second polarization vector to said second detector.

55. The sensor of claim 48 wherein an in-plane magnetization vector component measured along said hard axis of said at least one layer of magnetic material is proportional to a ratio of said external magnetic field to said magnetic material in-plane uniaxial anisotropy field value.

56. The sensor of claim 48 wherein an in-plane magnetization vector component of said at least one layer of magnetic material measured along said light plane of incidence is proportional to a ratio of said external magnetic field to said magnetic material in-plane uniaxial anisotropy field value.

57. The sensor of claim 50 wherein said at least one sensing element layer of magnetic material is disposed to intercept said first polarized light beam from said first polarizing element, and to reflect light having said altered polarization characteristic by converting a portion of said first polarization vector to said second polarization vector by an amount determined by an in-plane magnetization vector component of said at least one layer of magnetic material measured along said light plane of incidence, a magnitude of said first polarization vector and said magneto-optic Kerr effect value, as provided by the so-called longitudinal magneto-optic Kerr effect, said altered light being an information-containing component of said second polarization vector of said second polarized light beam.

58. The sensor of claim 57 wherein said information-containing component of said second polarization vector of said second polarized beam has an amplitude that is smaller than an amplitude of said information-independent second polarization vector component of said second polarized light beam.

59. The sensor of claim 48 wherein said first and second detectors are each selected from the group consisting of:

a semiconductor photodiode; and a photomultiplier tube.

60. The sensor of claim 50 wherein said magneto-optic Kerr effect sensing element is disposed on a glass block.

61. The sensor of claim 50 wherein said magneto-optic Kerr effect sensing element is disposed on a fiber optic coupler half block.

62. The sensor of claim 50 further comprising polarization-maintaining fiber optic cable coupled between each optical element of said magnetic field sensor for transmitting light between said optical elements.

63. The sensor of claim 62 wherein said first polarizing element is provided as a polarizing fiber optic cable.

64. The sensor of claim 48 wherein said reflective layer of magnetic material is provided as a thin metallic ferromagnetic film.

65. The sensor of claim 64 where said thin metallic ferromagnetic film is provided as an amorphous ferromagnetic alloy.

66. The sensor of claim 64 wherein said thin metallic ferromagnetic film is provided as an array of ellipsoidal thin film elements disposed upon the substrate.

67. The sensor of claim 48 further comprising a flux concentrator element disposed about said magneto-optic Kerr effect magnetic field sensing element.

68. The sensor of claim 67 wherein said flux concentrator element is provided as a ferromagnetic thin film.

* * * * *

UNITED STATES PATENT AND TRADEMARK OFFICE
CERTIFICATE OF CORRECTION

PATENT NO. : 5,736,856
DATED : April 7, 1998
INVENTOR(S) : Steven A. Oliver et al.

It is certified that error appears in the above-identified patent and that said Letters Patent is hereby corrected as shown below:

Column 25,
Line 63, "The sensor of claim 11" should read -- The sensor of claim 1 --;

Column 26,
Line 8, "The sensor of claim 11" should read -- The sensor of claim 1 --; and
Line 23, "ms" should read -- is --.

Signed and Sealed this

Eighteenth Day of June, 2002

Attest:

JAMES E. ROGAN
Attesting Officer     Director of the United States Patent and Trademark Office